United States Patent
Sato

(10) Patent No.: US 8,091,592 B2
(45) Date of Patent: Jan. 10, 2012

(54) BOARD STORAGE CONTAINER AND CHECK VALVE

(75) Inventor: Yoshinori Sato, Itoigawa (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 430 days.

(21) Appl. No.: 12/439,651

(22) PCT Filed: Jul. 23, 2007

(86) PCT No.: PCT/JP2007/064441
§ 371 (c)(1),
(2), (4) Date: Mar. 2, 2009

(87) PCT Pub. No.: WO2008/029557
PCT Pub. Date: Mar. 13, 2008

(65) Prior Publication Data
US 2009/0266441 A1 Oct. 29, 2009

(30) Foreign Application Priority Data
Sep. 4, 2006 (JP) ................................. 2006-239241

(51) Int. Cl.
*B65D 85/30* (2006.01)
(52) U.S. Cl. ............ 141/63; 141/98; 141/197; 141/302; 206/710; 220/300; 137/540
(58) Field of Classification Search .................. 141/63, 141/65–66, 98, 192, 197, 291, 301, 302, 141/325; 137/454.2, 543.15, 540; 220/300; 206/710
See application file for complete search history.

(56) References Cited

U.S. PATENT DOCUMENTS

| 4,901,749 A | * | 2/1990 | Hutto ........................... 137/270 |
| 5,810,062 A | | 9/1998 | Bonora et al. |
| 5,879,458 A | | 3/1999 | Roberson, Jr. et al. |

(Continued)

FOREIGN PATENT DOCUMENTS
JP 2002-521189 7/2002
(Continued)

OTHER PUBLICATIONS

International Search Report (English only) mailed Aug. 14, 2007 for PCT/JP2007/064441 (1 page).

(Continued)

*Primary Examiner* — Timothy L Maust
*Assistant Examiner* — Timothy Kelly
(74) *Attorney, Agent, or Firm* — Osha • Liang LLP

(57) ABSTRACT

A substrate container has a container main body to contain a substrate and a check valve which has a cylindrical housing and a valve disc installed in the housing and controls gas flowing from and to the interior and the exterior of the container main body, and is formed by inserting the housing into a through-hole of the container main body. When an end of the valve located inside the container main body is defined as a front end, a check valve has a fixing ring that is mounted on the rear end side in the manner of being rotatable relative to the housing and fixes the housing to the container main body from rearward, and the housing has a first housing installed on the front end side and a second housing inserted into the first housing at the front end and attached to the first housing.

15 Claims, 16 Drawing Sheets

U.S. PATENT DOCUMENTS

| | | | |
|---|---|---|---|
| 6,187,182 B1 | 2/2001 | Reynolds et al. | |
| 6,199,604 B1 * | 3/2001 | Miyajima | 141/98 |
| 6,319,297 B1 | 11/2001 | Fosnight | |
| 6,732,877 B2 * | 5/2004 | Wu et al. | 220/300 |
| 7,201,276 B2 * | 4/2007 | Burns et al. | 206/710 |
| 7,455,180 B2 * | 11/2008 | Sumi et al. | 206/710 |
| 7,503,343 B2 * | 3/2009 | Krishnamoorthy et al. | 137/588 |
| 7,658,289 B2 * | 2/2010 | Sumi et al. | 206/710 |
| 7,658,290 B2 * | 2/2010 | Sumi et al. | 206/710 |
| 2003/0047562 A1 | 3/2003 | Wu et al. | |
| 2005/0077204 A1 | 4/2005 | Sumi et al. | |

FOREIGN PATENT DOCUMENTS

| | | |
|---|---|---|
| JP | 2004-146676 | 5/2004 |
| JP | 2004-179449 | 6/2004 |
| JP | 2005-127501 | 5/2005 |
| WO | 99/50577 | 10/1999 |

OTHER PUBLICATIONS esp@cenet patent abstract JP2004-146676 dated May 20, 2004 (1 page).

esp@cenet patent abstract WO0006286 dated Feb. 10, 2000 (1 page). (Relates to Foreign Reference 2 above).

esp@cenet patent abstract JP2004-179449 dated Jun. 24, 2004 (1 page).

esp@cenet patent abstract JP2005-127501 dated May 19, 2005 (1 page).

Translation of the International Preliminary Report on Patentability and the Written Opinion of the International Searching Authority, for International patent application No. PCT/JP2007/064441, mailed Mar. 26, 2009, 5 pages.

Extended European Search Report with Patent Application No. 07791173.3, dated Oct. 22, 2010 (9 pages).

* cited by examiner

BOARD STORAGE CONTAINER AND CHECK VALVE

TECHNICAL FIELD

The present invention relates to: a substrate container used for storing, transporting, conveying, and retaining a precision substrate such as a semiconductor wafer, a mask glass, or the like; and a check valve attached to the substrate container.

BACKGROUND ART

In recent years, the miniaturization and the trends towards a finer pitch of wiring in a semiconductor component have been advancing. For that reason, a substrate container to store a semiconductor wafer (a precision substrate) is required to have a high hermeticity and the automization of handling in order to prevent the precision substrates from being contaminated. As such a substrate container, a substrate container equipped with a check valve used on the occasion of gas purge (for example, refer to Patent Documents 1 to 3) is known.

FIG. 16 is an exploded perspective view showing a check valve in a conventional substrate container. As shown in FIG. 16, in a conventional substrate container, a through-hole 51a is formed on a wall 51 of the container main body in which substrates are contained and a check valve 52 used on the occasion of gas purge is mounted in the through-hole 51a. The check valve 52 is provided with a valve disc 53 having an annular sealing face and a cylindrical housing 54 to contain the valve disc 53. The housing 54 has a retaining cylinder 55 installed on the inner face side of the container main body and a fixing cylinder 56 installed on the outer face side of the container main body and threads 55a and 56a are formed on the outer face side of the retaining cylinder 55 and on the inner face side of the fixing cylinder 56, respectively. Then the retaining cylinder 55 and the fixing cylinder 56 are placed in the manner of interposing the wall 51 in between and, by screwing them together, the housing 54 is formed and fixed to the wall.

Patent Document 1: Japanese Patent Application Laid-open No. 2004-146676
Patent Document 2: Japanese Patent Application Laid-open No. 2004-179449
Patent Document 3: Japanese Patent Application Laid-open No. 2002-521189

DISCLOSURE OF THE INVENTION

Problem to be Solved by the Invention

By the conventional technology described in Patent Documents 1 and 2 however, the retaining cylinder 55 and the fixing cylinder 56 are screwed together when the check valve is assembled, hence the assembly work is complicated, and the simplification of the assembly work is desired. Further, since the check valve is attached to the container main body by screw joint, the tightening torque has to be controlled and resulting problem has been that the control of the tightening torque requires great care.

The present invention has been established in order to solve such problems and an object of the present invention is to provide: a check valve that do not require the control of tightening torque and can simplify assembly work; and a substrate container equipped with the check valve.

Means for Solving the Problem

A substrate container according to the present invention is, in a substrate container: equipped with a container main body to contain a substrate and a check valve which has a cylindrical housing and a valve disc installed in the housing and controls gas flowing from and to the interior and the exterior of the container main body; and formed by inserting the housing into a through-hole of the container main body, characterized in that, when an end of the valve located inside the container main body is defined as a front end: the check valve has a fixing ring that is mounted on the rear end side in the manner of being rotatable relative to the housing and fixes the housing to the container main body from rearward; the housing has a first housing installed on the front end side and a second housing inserted into the first housing at the front end and attached to the first housing; the first housing has a fixing piece protruding rearward from the rear end and a fixing claw being formed at the rear end of the fixing piece and fixing the fixing ring; the fixing ring has a cylindrical sidewall mounted outside the first housing and a flange protruding outward from the sidewall; and on the inner circumferential face of the sidewall, a guide recess extending in the axial direction and guiding the fixing claw, a detent protruding inward and abutting on the fixing piece, and a hook bent from the detent in the circumferential direction and locked to the fixing piece are installed.

Such a substrate container has a check valve being placed so that the front end side of the check valve may be located inside the container main body and controlling gas flowing from and to the interior and the exterior of the container main body, and the housing of the check valve has a first housing installed on the front end side and a second housing installed on the rear end side. Further, the substrate container has a fixing ring in the housing that is mounted from the rear side of the housing in the manner of being rotatable relative to the housing and fixes the check valve to the container main body. Consequently, the check valve can be fixed to the container main body with the fixing ring and hence it is unnecessary to fix the check valve with screws and control tightening torque unlike the conventional case. Further, the first housing has a fixing piece and a fixing claw to fix the fixing ring to the first housing and hence it is possible to firmly fix the check valve to the container main body by plunging the fixing ring. Further, the fixing ring has a flange protruding outward and hence it is possible to stably fix the check valve by abutting the flange on the container main body. Furthermore, the fixing ring has a guide recess to guide the fixing claw in the axial direction on the cylindrical sidewall mounted on the outside of the first housing and hence it is possible to smoothly mount the fixing ring on the first housing and improve the efficiency of assembly work. Yet further, a detent protruding inward and abutting on the fixing piece, and a hook bent from the detent in the circumferential direction and locked to the fixing piece are installed on the inner circumferential face of the sidewall of the fixing ring and hence it is possible to lock the hook of the fixing ring to the fixing piece of the housing by mounting the fixing ring on the fixing piece and rotating the fixing ring relative to the housing.

Here it is desirable that the check valve further has a positioning mechanism to position the second housing to the first housing and a locking mechanism to lock the second housing to the first housing. Consequently, it is possible to position the second housing to the first housing with the positioning mechanism and lock the second housing to the first housing with the locking mechanism. As a result, screw joint is not required when the first housing and the second housing are assembled unlike the conventional case and assembly work can be simplified.

Further, it is desirable that: the second housing has a folded flange being folded back from the front end side and abutting on the inner circumferential face of the first housing all around the circumference; and the locking mechanism has a locking recess formed on the inner circumferential face of the first housing and a locking protrusion being formed at the folded flange of the second housing and engaging with the locking recess. Consequently, it is possible to engage the locking recess formed on the inner circumferential face of the first housing with the locking protrusion formed at the folded flange of the second housing by plunging the second housing to the first housing. As a result, it is possible to simplify assembly work.

Furthermore, it is desirable that the positioning mechanism has a positioning recess formed at the rear end of the first housing and a positioning protrusion being formed at the folded flange of the second housing and engaging with the positioning recess. Consequently, it is possible to position the second housing to the first housing with the positioning recess formed at the rear end of the first housing and the positioning protrusion formed at the folded flange of the second housing.

Yet further, it is desirable that: the valve disc has a columnar shape; the valve disc has an end at which an annular sealing face is formed, an annular flange at which an annular biasing face biased by a biasing means is formed, and other end at which a degassing recess allowing gas to pass through is formed in a radial direction; the annular sealing face is nearly concentric with the annular biasing face; and the outer diameter of the annular biasing face is not smaller than the outer diameter of the annular sealing face. Consequently, the outer diameter of the annular biasing face biased by a biasing means is not smaller than the outer diameter of the annular sealing face in the valve disc and hence it is possible to prevent the valve disc from tilting and seal off gas without fail. Further, a degassing recess allowing gas to pass through is formed in a radial direction at the other end opposite to the end at which the sealing face is formed and hence it is possible to pass through gas in the degassing recess even when the other end touches the flat face. As a result, unnecessary sealing face is not formed on the side opposite to the sealing face. Here, when the portion where the biasing means touches the annular flange is linear, the linear touching portion is used as the biasing face and the diameter of the linear touching portion is regarded as "the outer diameter of the biasing face."

Still further, a check valve according to the present invention is, in a check valve being inserted into a through-hole of the container main body of a substrate container containing a substrate and controlling gas flowing from and to the interior and the exterior of the substrate container, characterized in that, when an end of the check valve located inside the container main body is defined as a front end: the check valve has a cylindrical housing mounted on the through-hole, a valve disc contained in the housing, and a fixing ring that is mounted on the rear end side of the housing in the manner of being rotatable relative to the housing and fixes the housing to the container main body from rearward; the housing has a first housing installed on the front end side and a second housing inserted into the first housing at the front end and attached to the first housing; the first housing has a fixing piece protruding rearward from the rear end and a fixing claw being formed at the rear end of the fixing piece and fixing the fixing ring; the fixing ring has a cylindrical sidewall mounted outside the first housing and a flange protruding outward from the sidewall; and on the inner circumferential face of the sidewall, a guide recess extending in the axial direction and guiding the fixing claw, a detent protruding inward and abutting on the fixing piece, and a hook bent from the detent in the circumferential direction and locked to the fixing piece are installed.

In the case of such a check valve, when an end of the check valve located inside the container main body is defined as a front end, the cylindrical housing has a first housing installed on the front end side and a second housing installed on the rear end side. Further, the check valve has a fixing ring that is mounted from rear side of the housing in the manner of being rotatable relative to the housing and fixes the housing to the container main body. Consequently, it is possible to fix the check valve to the container main body with the fixing ring and hence it is unnecessary to fix the check valve with screws and control tightening torque unlike the conventional case. Further, the first housing has a fixing piece and a fixing claw to fix the fixing ring to the first housing and hence it is possible to fix the check valve to the container main body without fail. Furthermore, the fixing ring has a flange protruding outward and hence it is possible to fix the check valve stably by abutting the flange on the container main body. Yet further, the fixing ring has a guide recess to guide the fixing claw in the axial direction on the cylindrical sidewall mounted on the outside of the first housing and hence it is possible to mount the fixing ring to the first housing smoothly and improve the efficiency of assembly work. Still further, on the inner circumferential face of the sidewall of the fixing ring, a detent protruding inward and abutting on the fixing piece and a hook bent from the detent in the circumferential direction and locked to the fixing piece are installed. Hence it is possible to lock the hook of the fixing ring to the fixing piece of the housing by mounting the fixing ring on the fixing piece and rotating the fixing ring relative to the housing.

Here, it is desirable that the check valve further has a positioning mechanism to position the second housing to the first housing and a locking mechanism to lock the second housing to the first housing. Consequently, it is possible to position the second housing to the first housing with the positioning mechanism and lock the second housing to the first housing with the locking mechanism. As a result, it is unnecessary to use screw joint unlike the conventional case when the first housing and the second housing are assembled and it is possible to simplify the assembly work.

Effect of the Invention

The present invention makes it possible to provide: a check valve that does not require the control of tightening torque and can simplify assembly work; and a substrate container equipped with the check valve.

DESCRIPTION OF REFERENCE SYMBOLS

Figure 1:
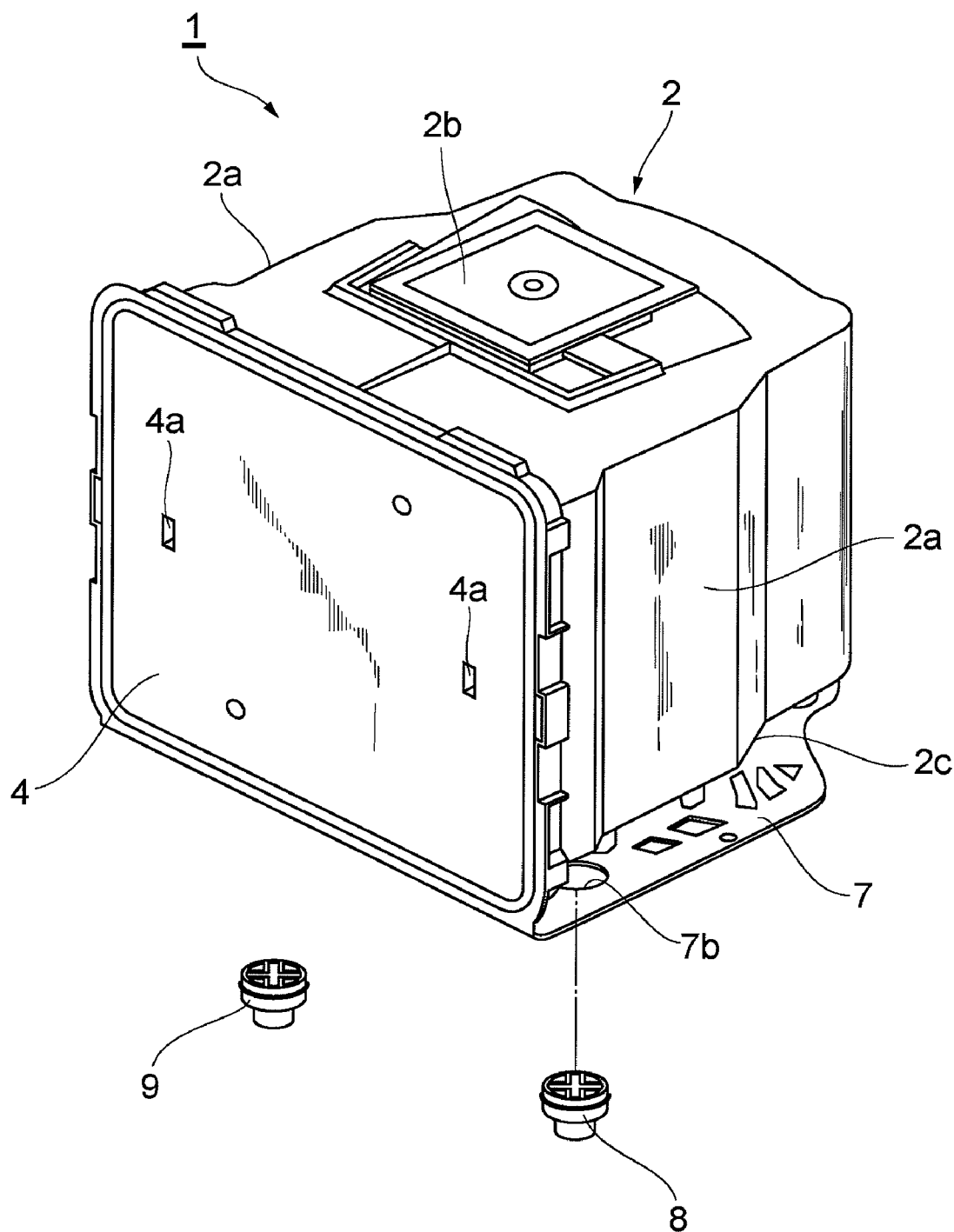
FIG. 1 is an exploded perspective view showing a substrate container having a suction valve and an exhaust valve according to an embodiment of the present invention.

1 Substrate container
2 Container main body
2d Through-hole of container main body
8 Suction valve (check valve)
9 Exhaust valve (check valve)
11 Housing
12 Fixing cylinder (first housing)
12d locking recess (locking mechanism)
12e Positioning recess (positioning mechanism)
12g Fixing piece
12i Fixing claw
13, 23 Valve disc
13a, 23a An end of valve disc
13b, 23b The other end of valve disc
13c, 23c Degassing recess
13e, 23e Annular flange
13f, 23f Biasing face
14 Valve disc containing cylinder (second housing)
14a Folded flange
14b Locking protrusion (locking mechanism)
14c Positioning protrusion (positioning mechanism)
17 Compression coil spring (biasing means)
18a Annular sealing face
19 Fixing ring
19a Sidewall
19b Flange
19c Guide recess
19d Detent
19e Hook

BEST MODES FOR CARRYING OUT THE INVENTION

Figure 2:
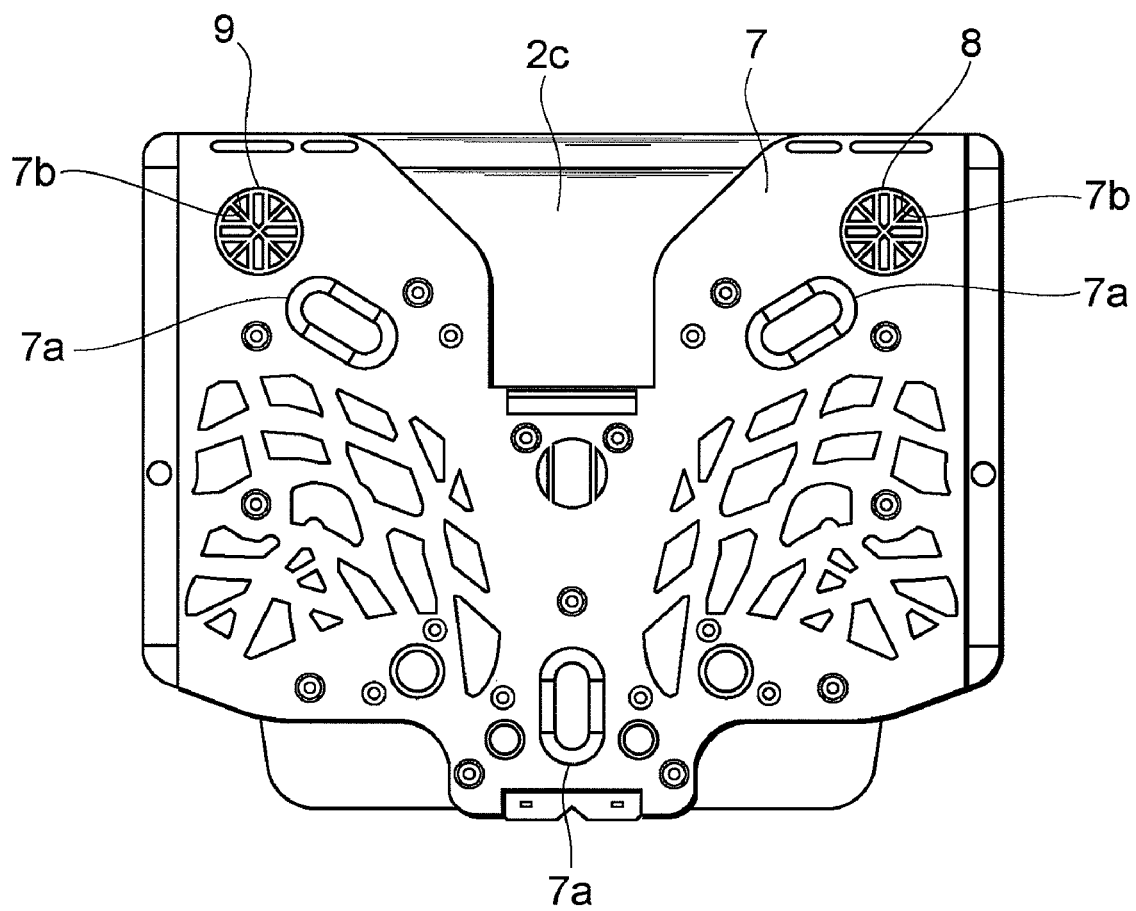
FIG. 2 is a bottom view of the substrate container shown in FIG. 1.

A preferable embodiment of a substrate container and check valves according to the present invention is hereunder explained in reference to drawings. The substrate container according to the present embodiment has a suction valve and an exhaust valve as the check valves. Here, in the explanations of drawings, identical or equivalent components are denoted by the same reference symbols and duplication of the explanations is avoided. FIG. 1 is an exploded perspective view showing a substrate container having a suction valve and an exhaust valve according to an embodiment of the present invention and FIG. 2 is a bottom view of the substrate container shown in FIG. 1.

The substrate container 1 shown in FIG. 1 is a substrate container that contains plural semiconductor wafers (substrates; not shown in the figure) (25 or 26 sheets for example) 300 mm (about 12 inches) in diameter for example and is used for transporting, conveying, and retaining the semiconductor wafers. The substrate container 1 is of a so-called front open box type and has a container main body 2 to store the substrates and a lid 4 with which an opening formed on the container main body 2 is covered. Further, in the present description, the face on which the opening is formed (the face on which the lid 4 is installed) is defined as "the front face of the container main body 2" and the words "front," "rear," "left," and "right" are used for expressing the directions.

The container main body 2 has a shape of a box and has an opening to take substrates in and out on the face on the left side in the figure. Supports to support plural substrates aligned parallel in the vertical direction are installed on the inner faces of a pair of opposing sidewalls 2a of the container main body 2. Further, plural (two in the present embodiment) through-holes 2d piercing through from the interior to the exterior are formed on a bottom wall 2c of the container main body 2 (refer to FIG. 3). A cylindrical rib 10 is formed at the rim of each of the through-holes 2d in the manner of protruding downward. Further, a robotic handle 2b for roof transportation is installed on the top plate of the container main body 2.

The opening is closed with the lid 4 with a sealing gasket interposed between the container main body 2 and the lid 4. The lid 4 incorporates a latch mechanism with which the lid 4 is locked to the opening of the container main body 2. On the front face side of the lid 4 (on the outer face side of the substrate container), operation holes 4a into which operation keys to operate the latch mechanism are inserted are formed. It is possible to extract and retract locking claws of the latch mechanism from the lid 4 to the side of the container main body 2 by inserting the operation keys into the operation holes 4a and rotating the operation keys by 90 degrees from side to side. It is possible to make the lid 4 detachable from the container main body 2 by inserting and rotating the operation keys by 90 degrees counterclockwise and retracting the locking claws of the latch mechanism from the positions where the locking claws protrude to the side of the container main body 2 to the side of the lid 4. On the other hand, when the lid 4 is attached to the container main body 2, it is possible to lock the lid 4 to the container main body 2 by attaching the lid 4 in the state where the locking claws are retracted inside to the container main body 2, rotating the operation keys by 90 degrees clockwise, and protruding the locking claws of the latch mechanism. Further, on the rear face side of the lid 4 (on the outer face side of the substrate container), a retainer to support plural substrates aligned parallel in the vertical direction is installed.

As shown in FIG. 2, a bottom plate 7 is fixed on the outer face side of the bottom wall 2c (the bottom) of the container main body 2. The bottom wall 2c is covered with the bottom plate 7 and the bottom plate 7 has positioning members 7a used for positioning the substrate container 1 to a processing apparatus or the like to which the substrate container 1 is applied. Further, the bottom plate 7 has openings 7b to expose a suction valve 8 and an exhaust valve 9 to the exterior. The openings 7b are formed at positions corresponding to the through-holes 2d of the container main body 2.

Further, the substrate container 1 has the suction valve 8 and the exhaust valve 9 to control gas flowing from and to the interior and the exterior of the container main body 2 as stated above. The suction valve 8 and the exhaust valve 9 are used when gas in the substrate container 1 is replaced. The suction valve 8 functions as a supply-side open/close valve used when gas is supplied to the interior and the exhaust valve 9 functions as an exhaust-side open/close valve used when gas is exhausted to the exterior.

Figure 3:
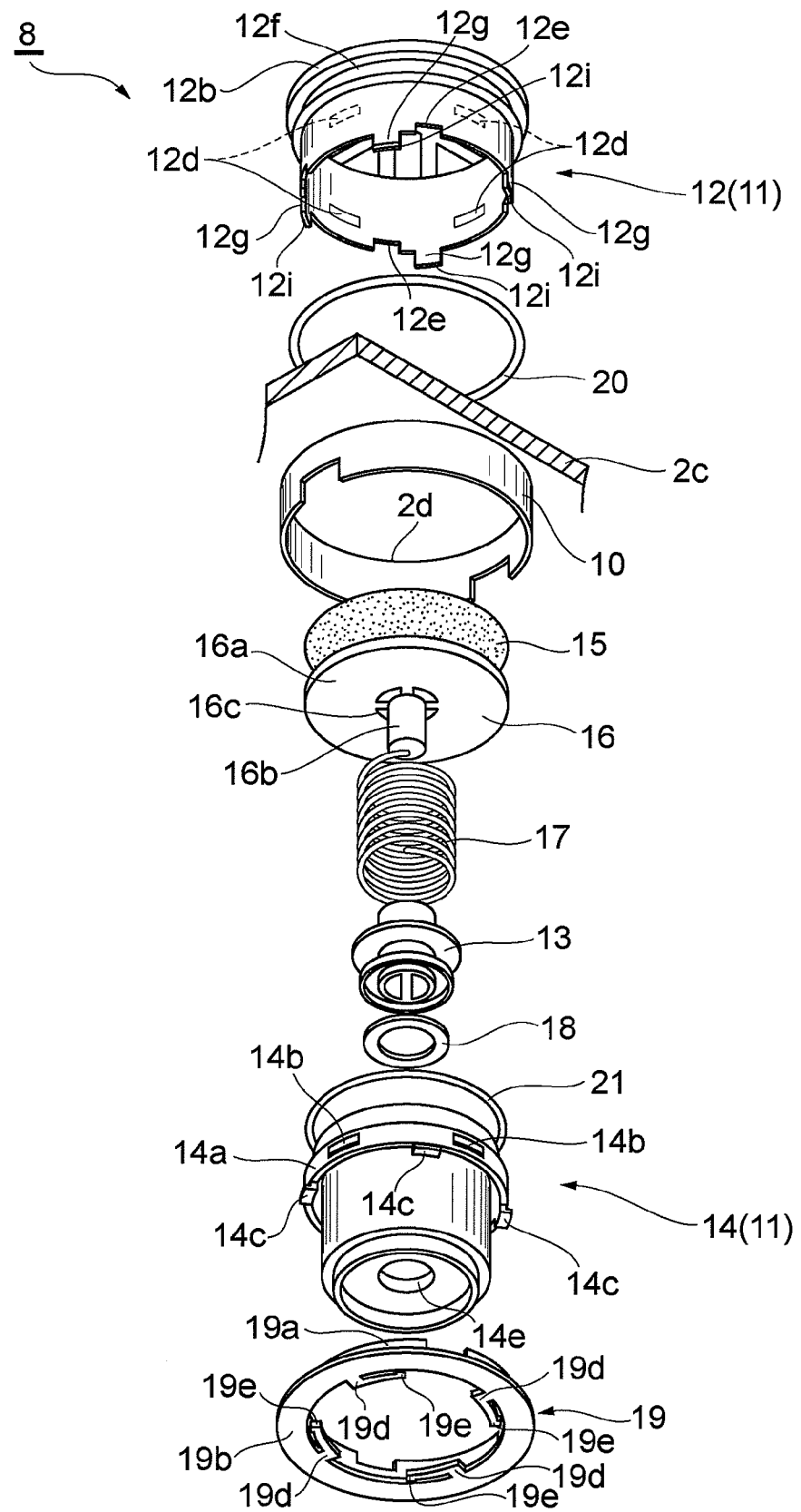
FIG. 3 is an exploded perspective view showing the suction valve shown in FIG. 1.
Figure 4:
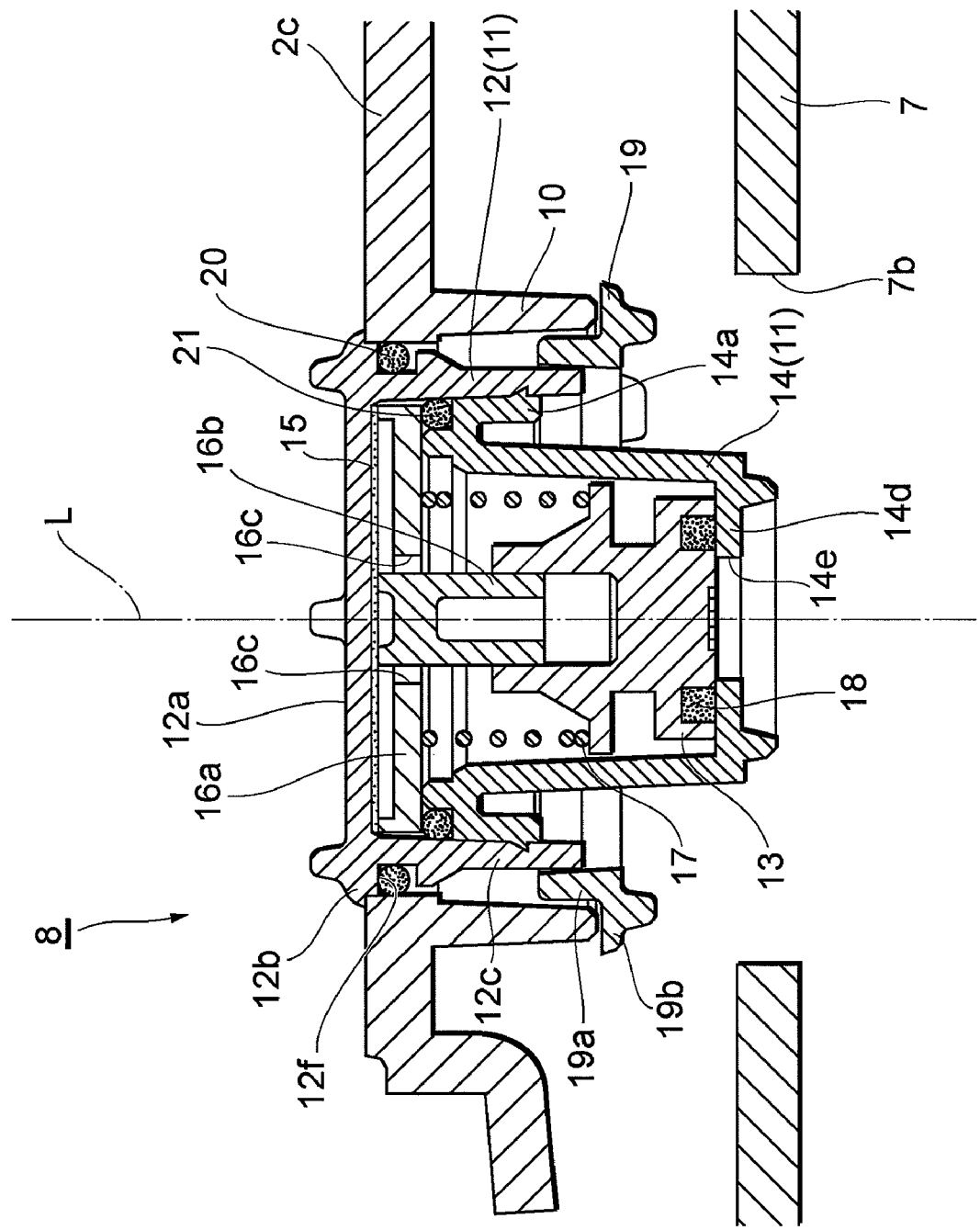
FIG. 4 is a sectional view showing the suction valve in the closed state.
Figure 5:
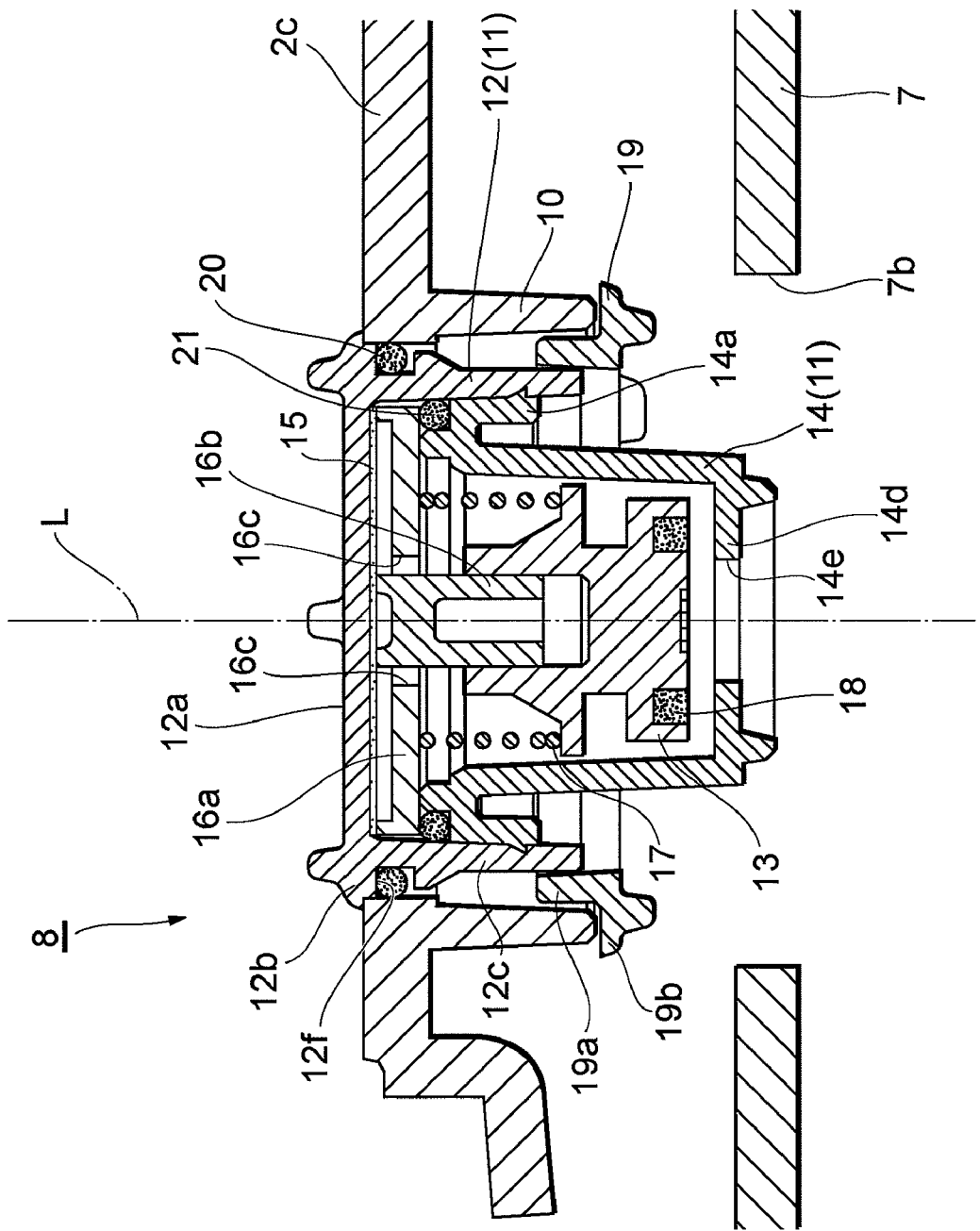
FIG. 5 is a sectional view showing the suction valve in the open state.
Figure 6:
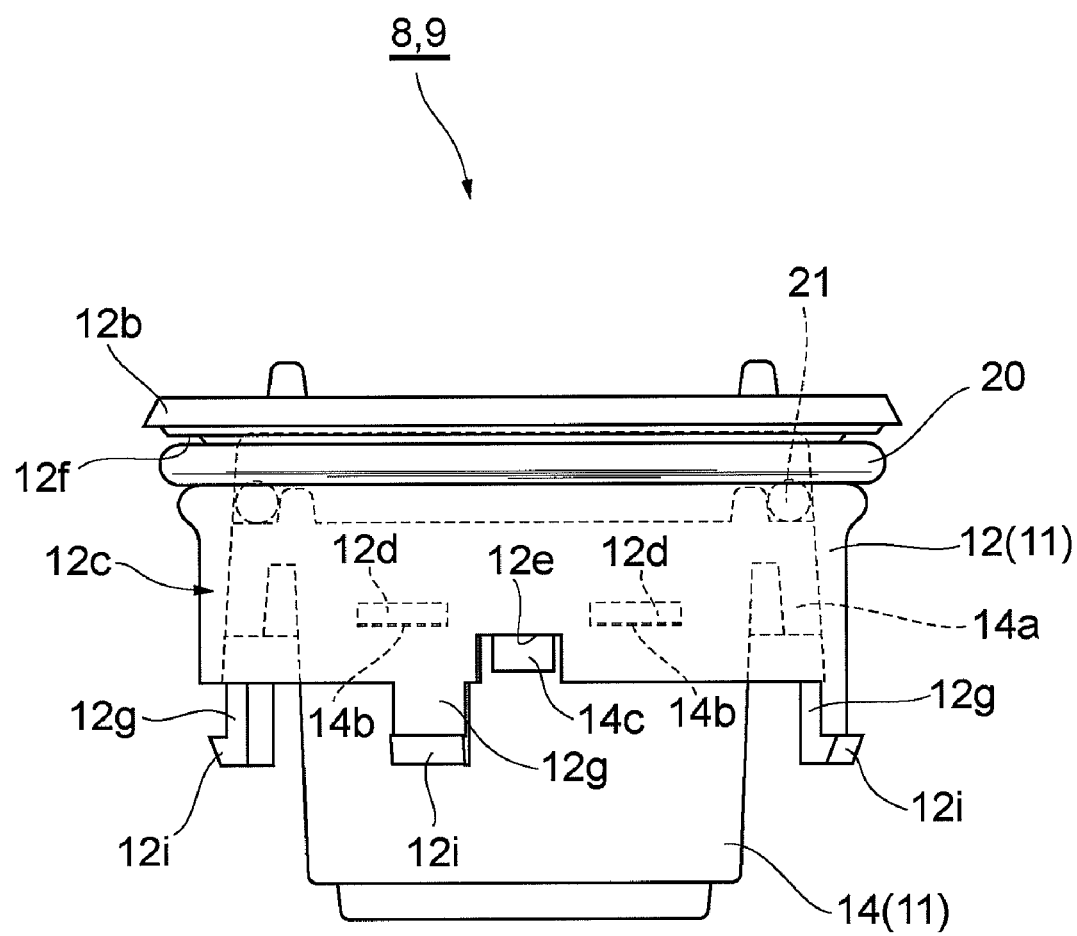
FIG. 6 is a side view of the housing shown in FIG. 3.
Figure 7:
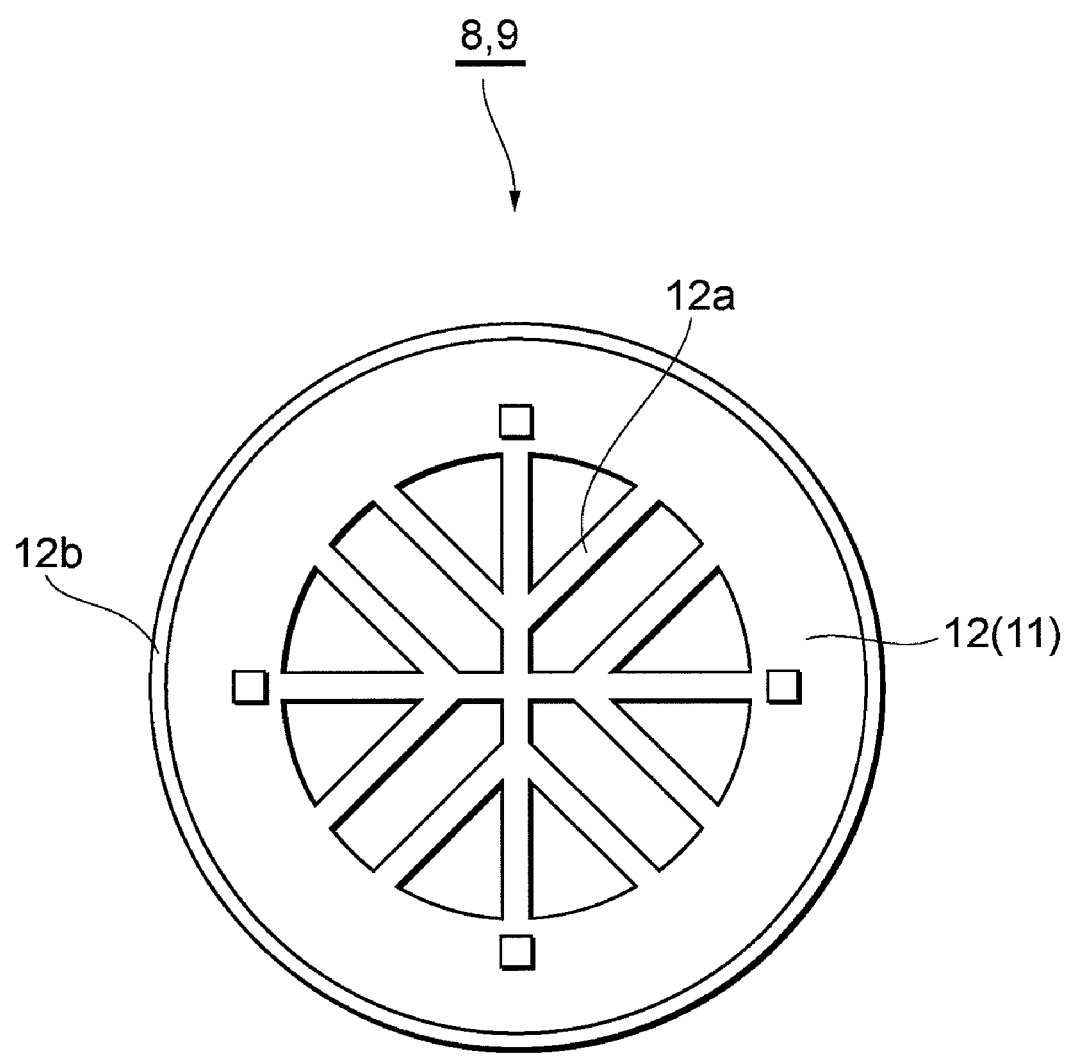
FIG. 7 is a plan view of the housing shown in FIG. 6.
Figure 8:
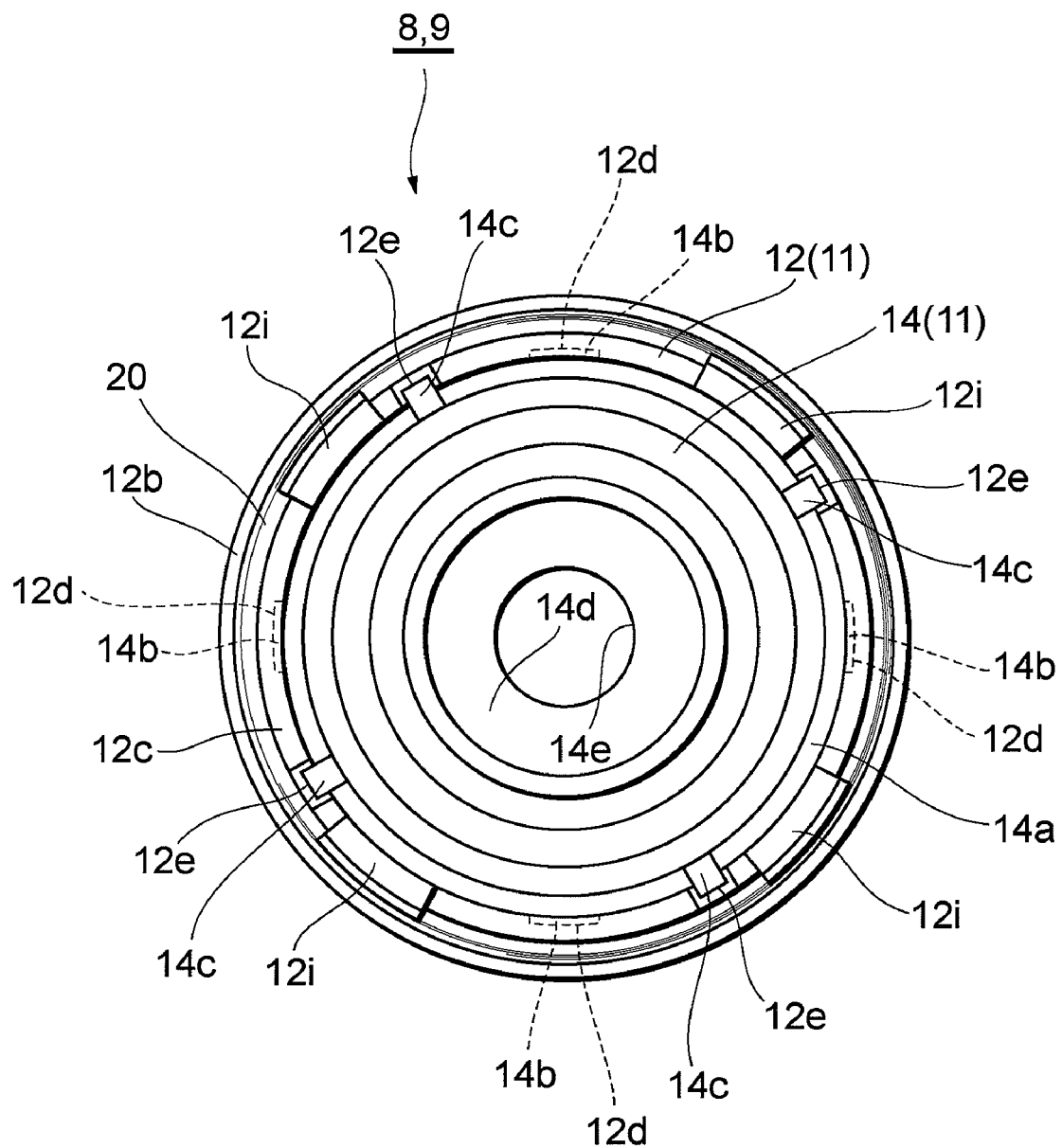
FIG. 8 is a bottom view of the housing shown in FIG. 6.
Figure 9:
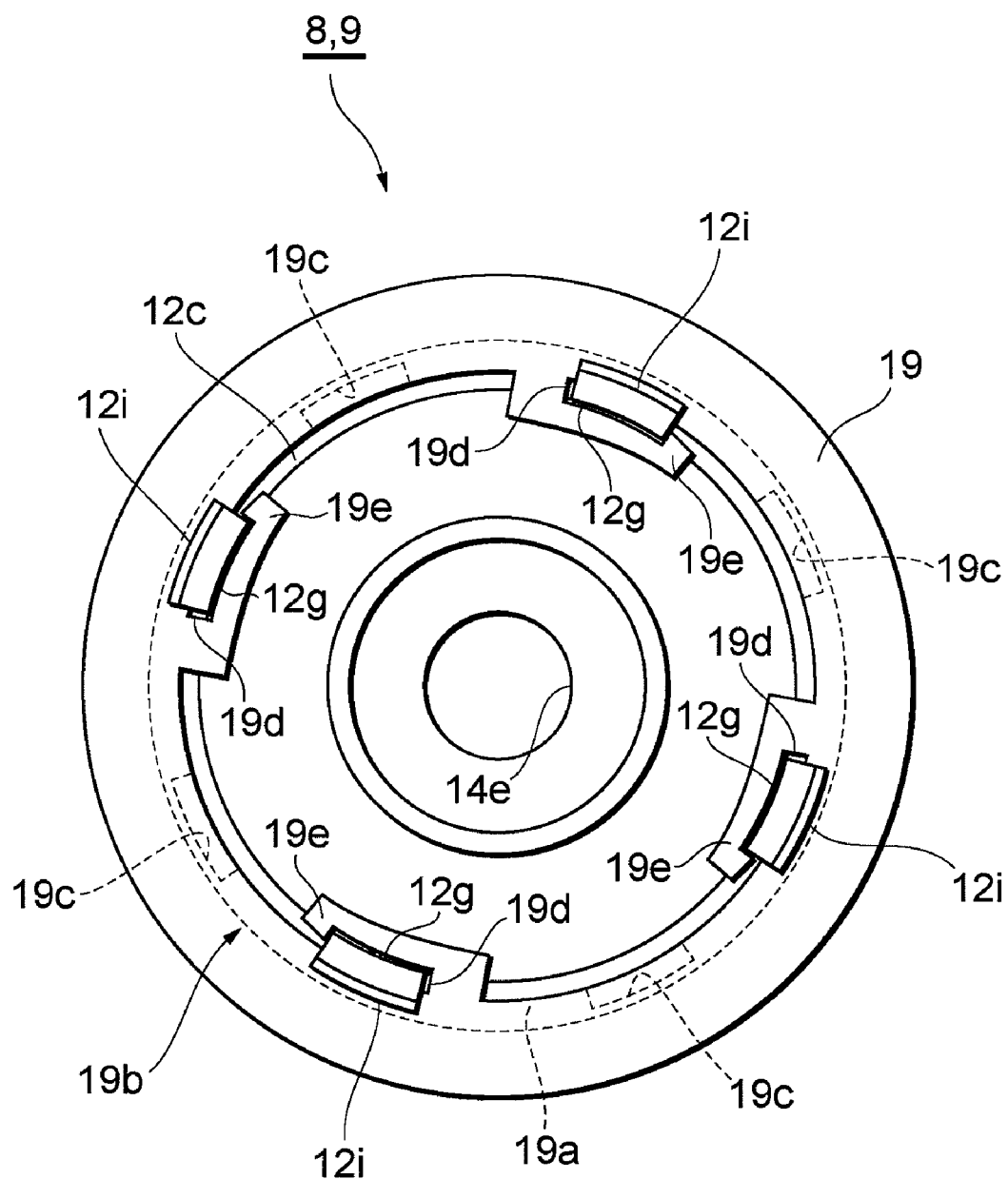
FIG. 9 is a bottom view showing the housing in the state where a fixing ring is locked.
Figure 10:
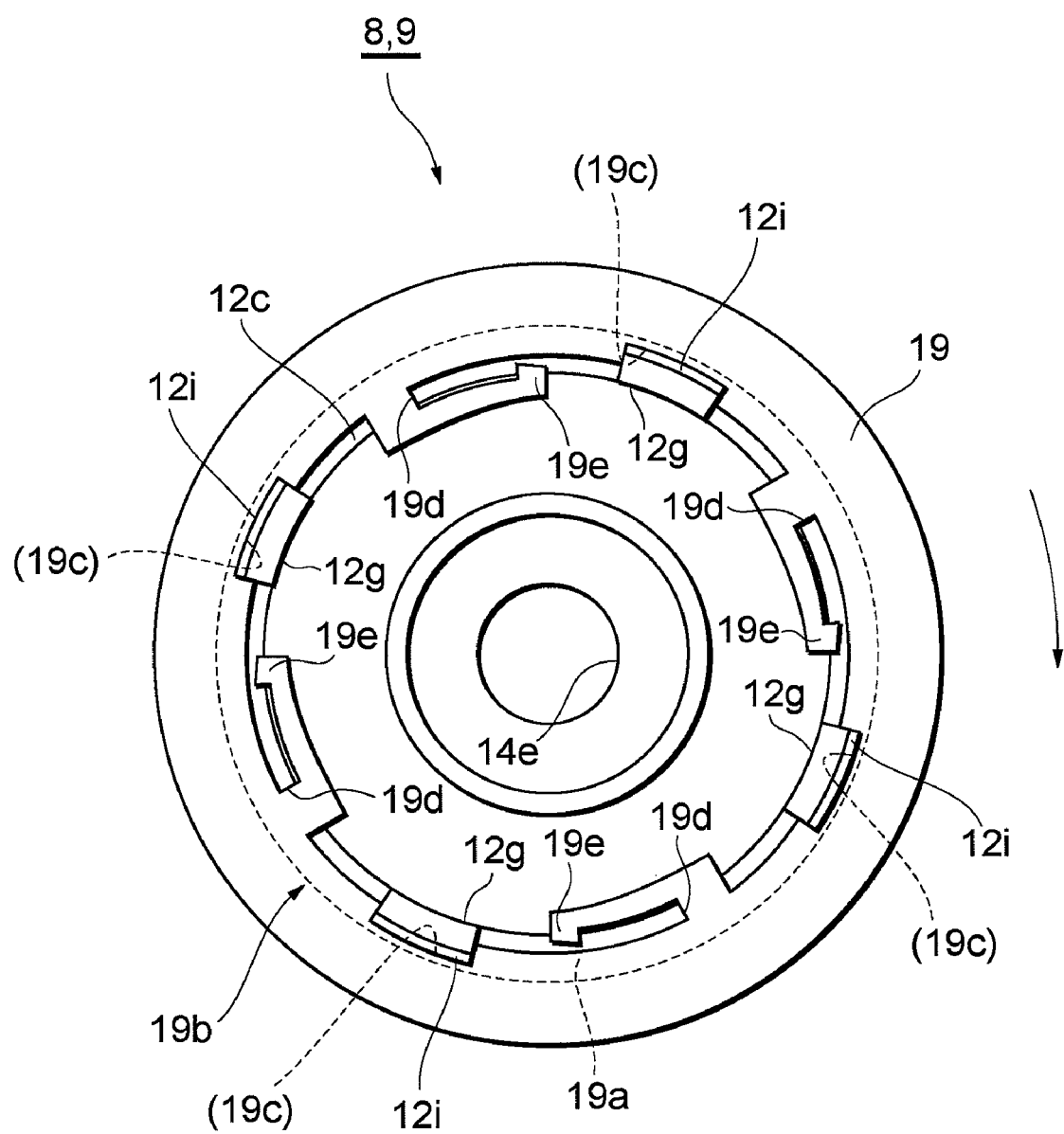
FIG. 10 is a bottom view showing the housing in the state where a fixing ring is not locked.
Figure 11:
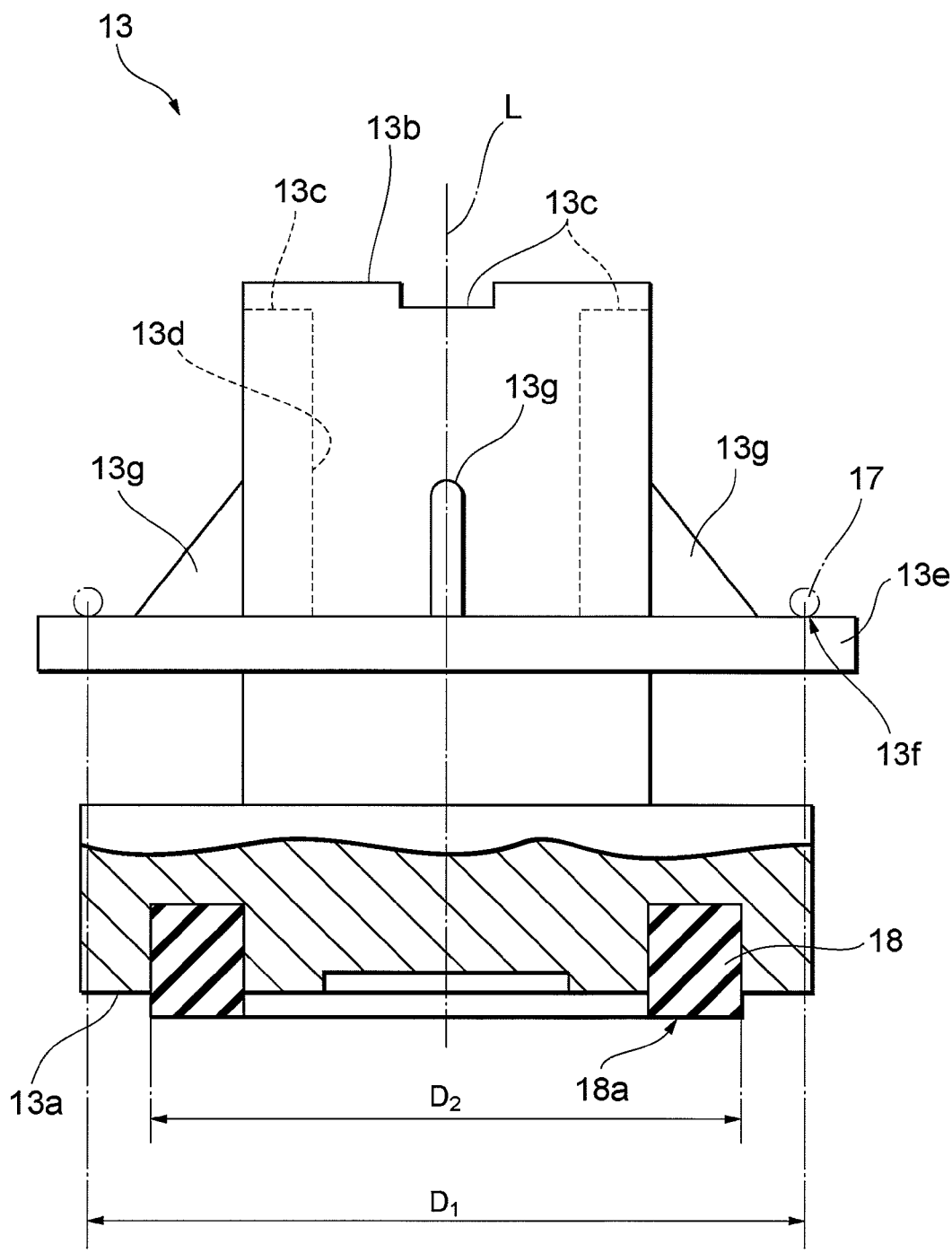
FIG. 11 is a side view showing the valve disc shown in FIG. 3.
Figure 12:
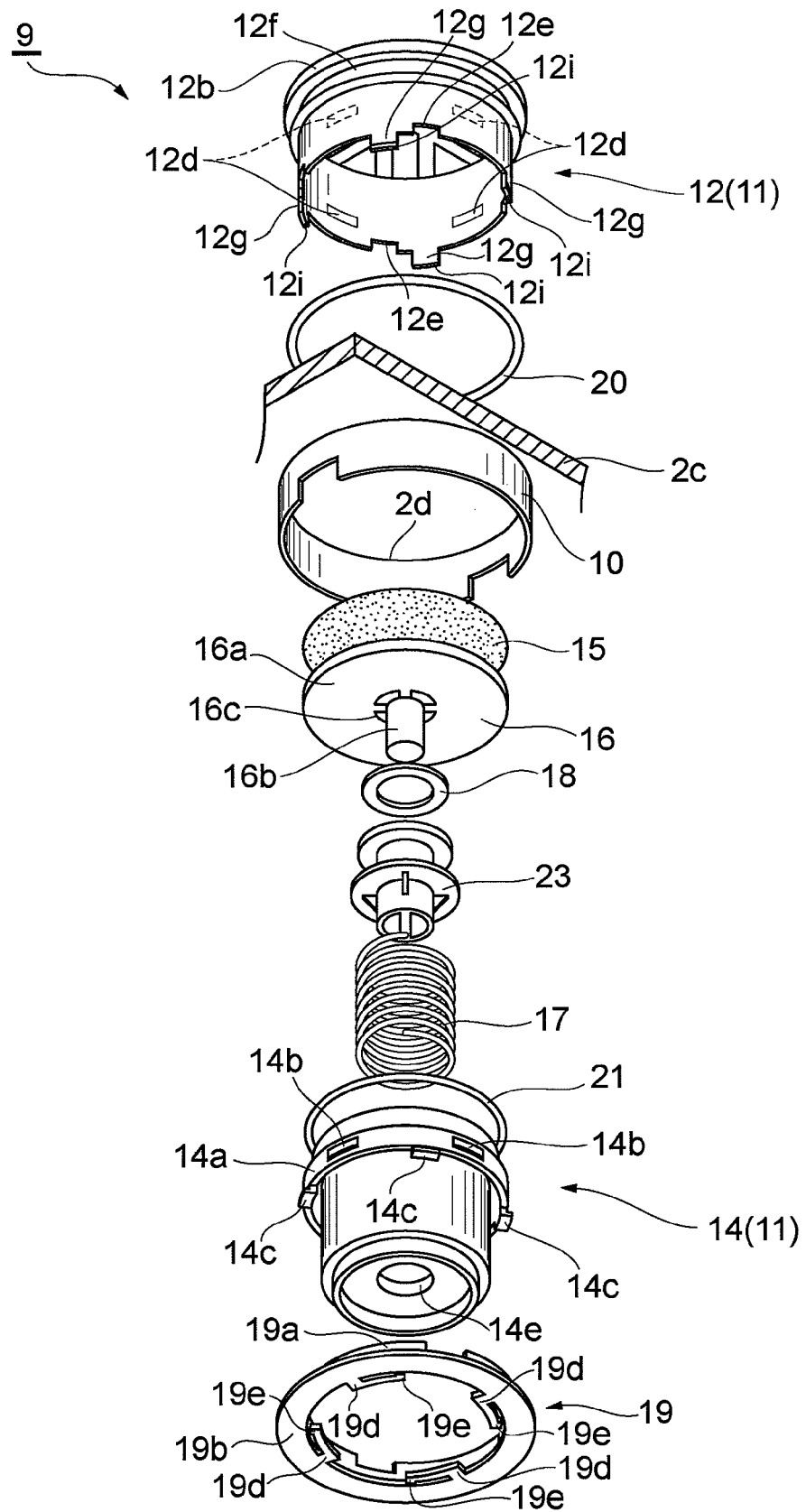
FIG. 12 is an exploded perspective view showing the exhaust valve shown in FIG. 1.
Figure 13:
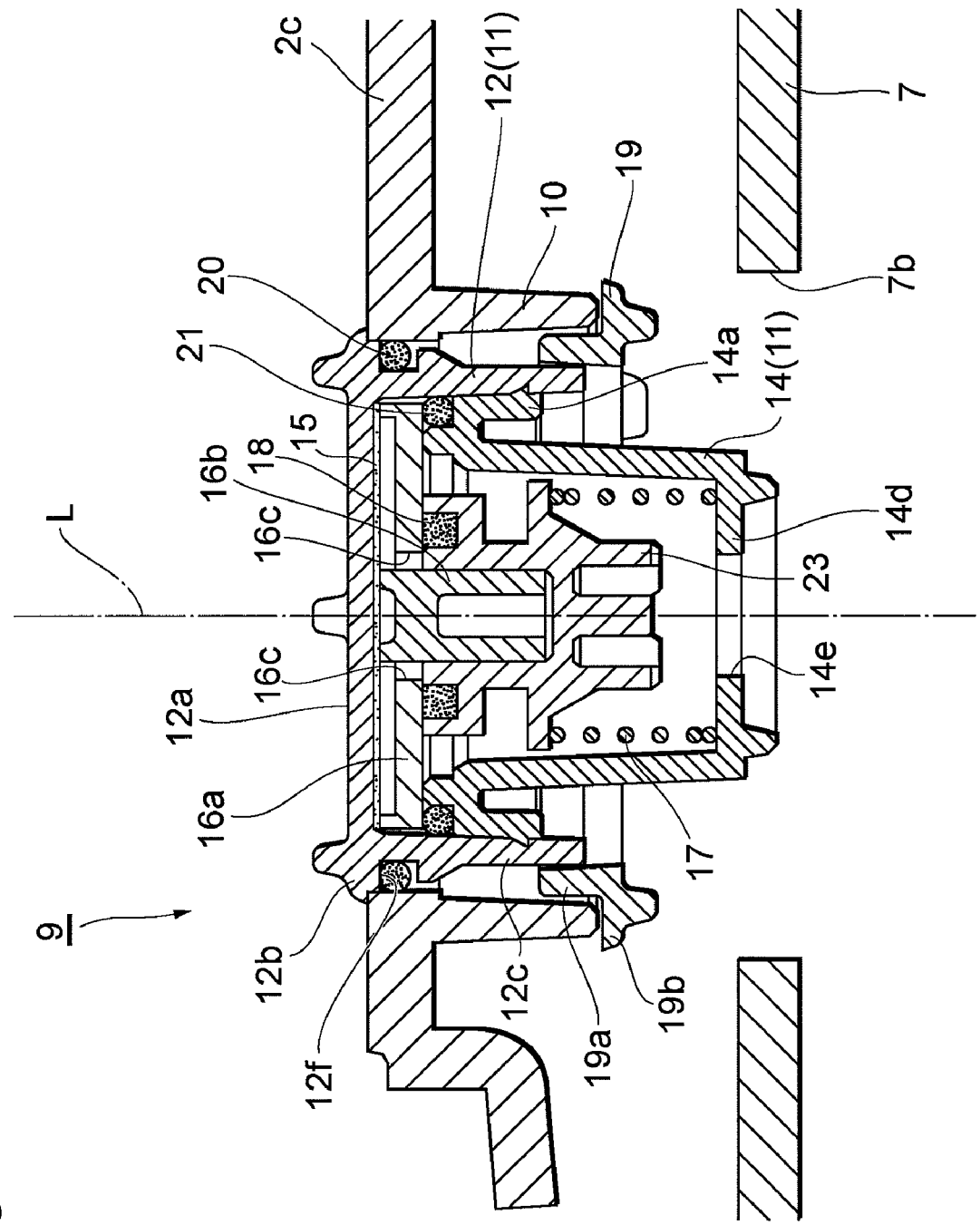
FIG. 13 is a sectional view showing the exhaust valve in the closed state.
Figure 14:
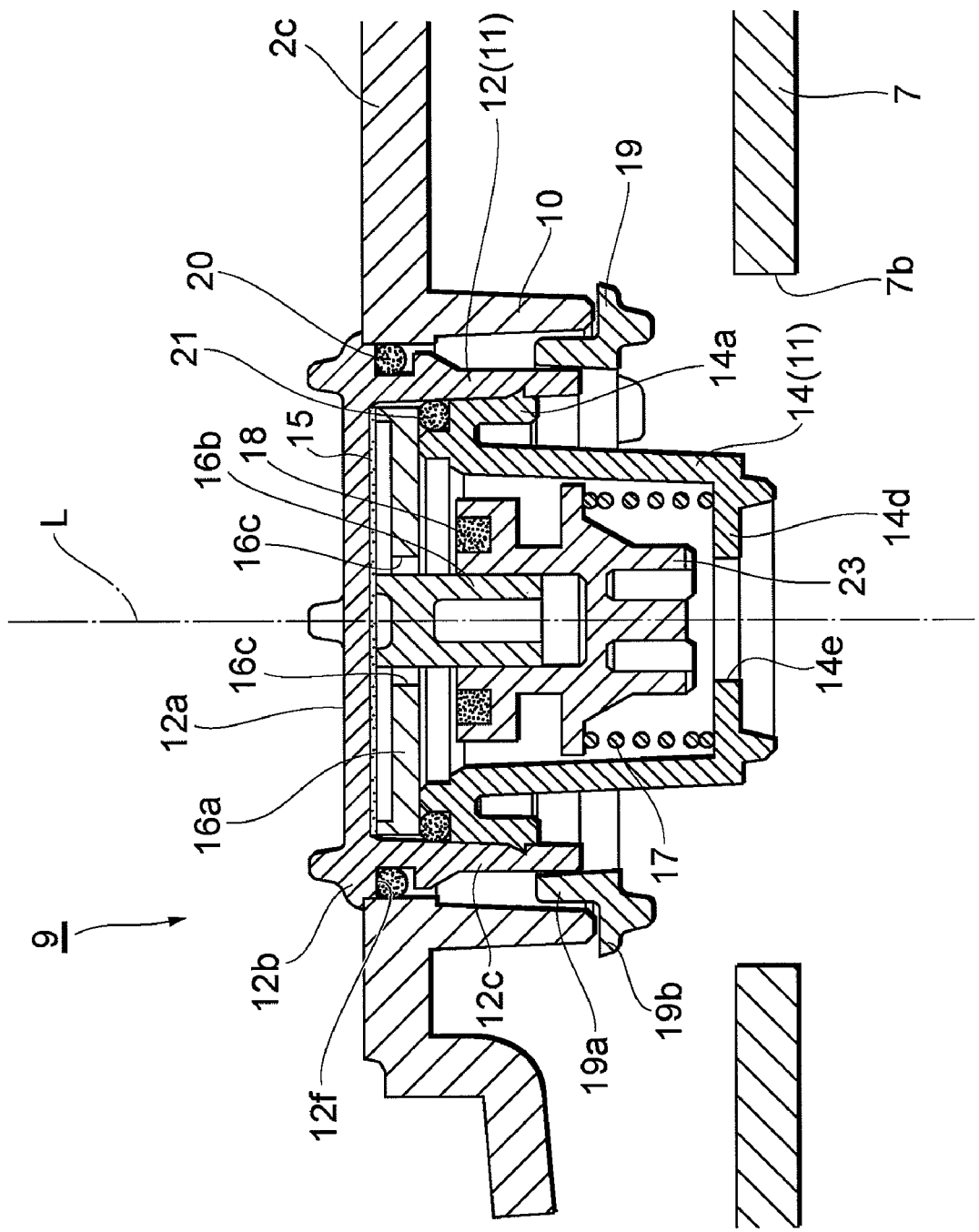
FIG. 14 is a sectional view showing the exhaust valve in the open state.
Figure 15:
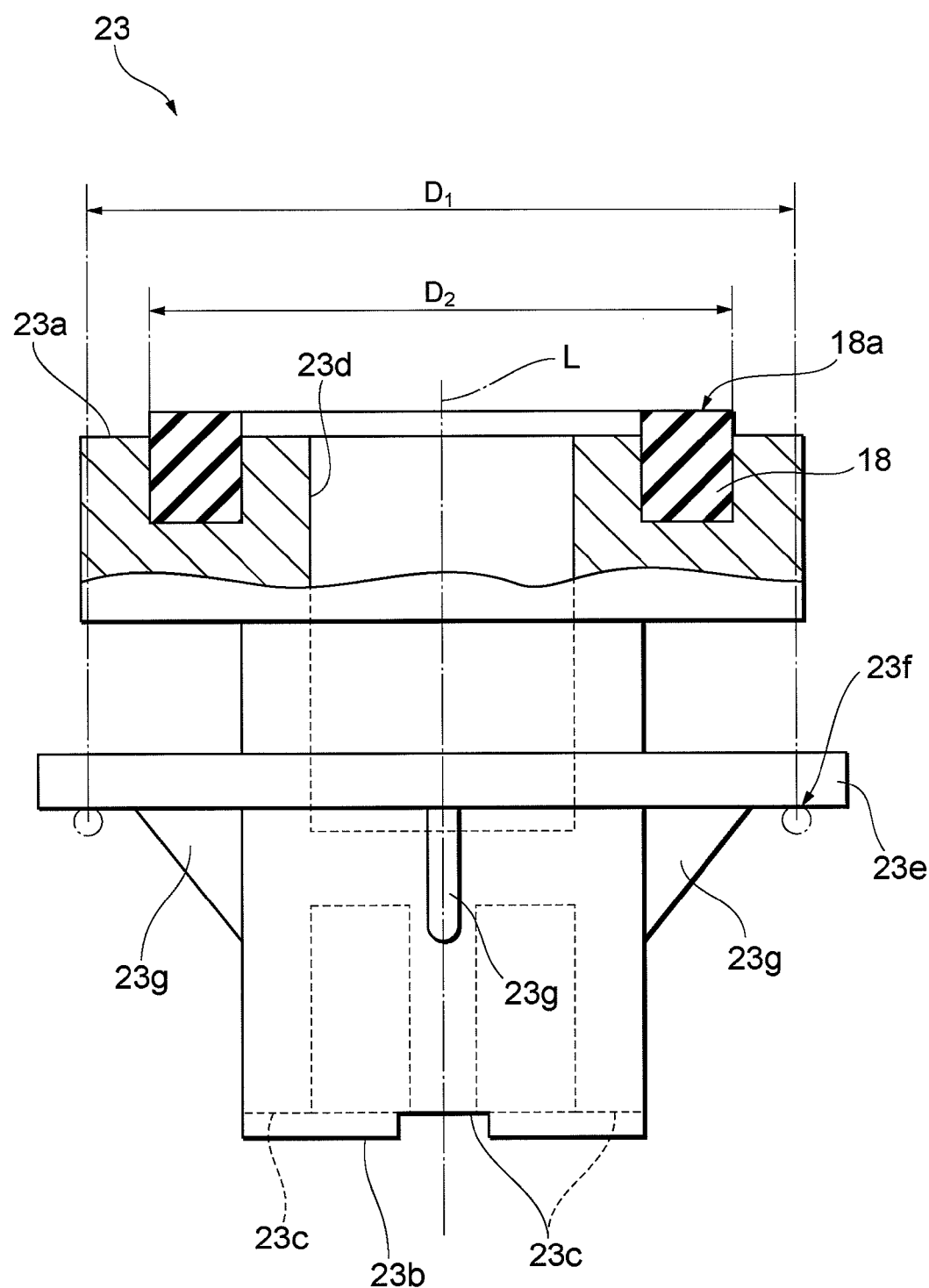
FIG. 15 is a side view showing the valve disc shown in FIG. 12.
Figure 16:
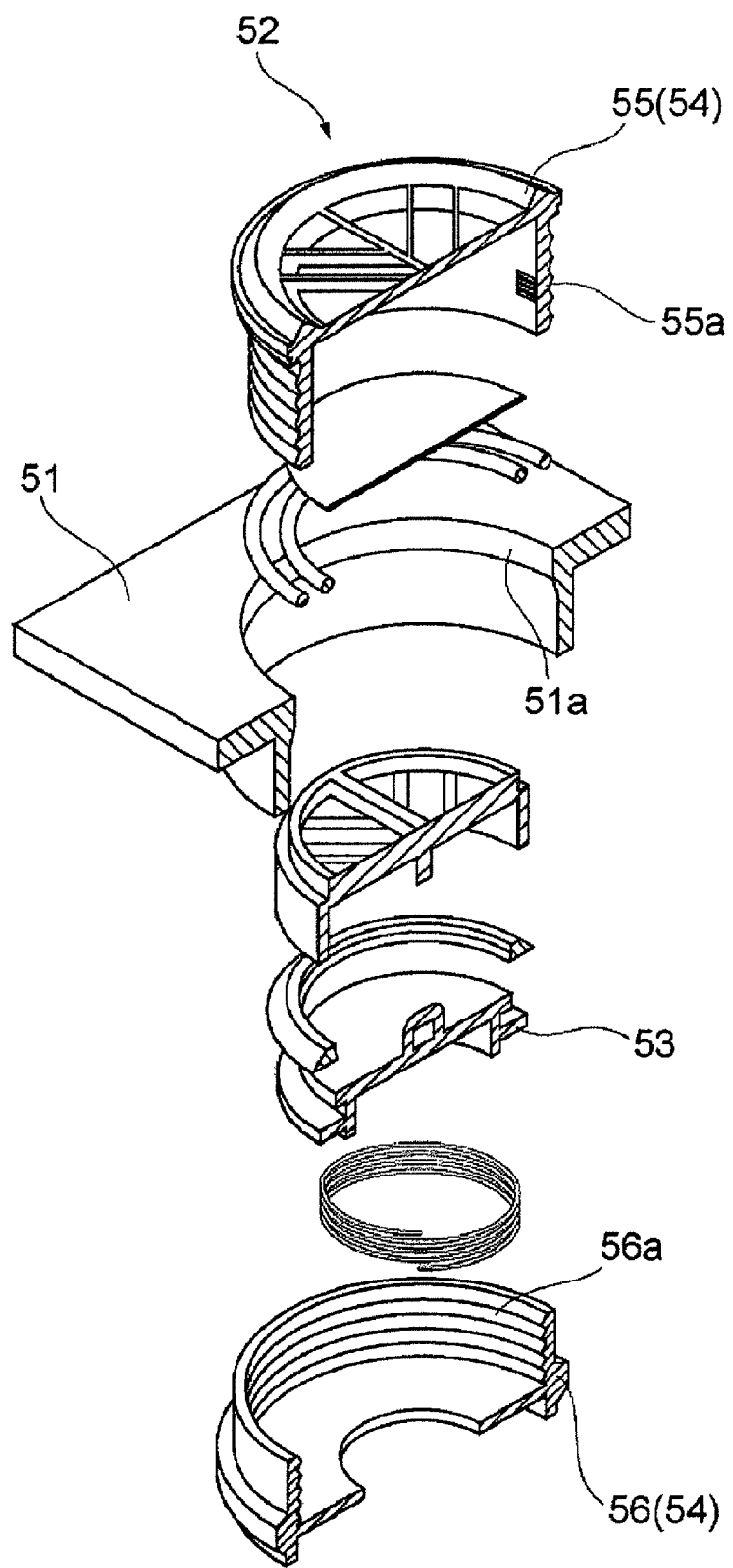
FIG. 16 is an exploded perspective view showing a check valve in a conventional substrate container.

The suction valve 8 and the exhaust valve 9 (hereunder referred to as check valves 8 and 9 when both the suction valve 8 and the exhaust valve 9 are denoted) are hereunder explained. FIG. 3 is an exploded perspective view showing the suction valve shown in FIG. 1. FIG. 4 is a sectional view showing the suction valve in the closed state. FIG. 5 is a sectional view showing the suction valve in the open state. FIG. 6 is a side view of the housing shown in FIG. 3. FIG. 7 is a plan view of the housing shown in FIG. 6. FIG. 8 is a bottom view of the housing shown in FIG. 6. FIG. 9 is a bottom view showing the housing in the state where a fixing ring is locked. FIG. 10 is a bottom view showing the housing in the state where a fixing ring is not locked. FIG. 11 is a side view showing the valve disc shown in FIG. 3. FIG. 12 is an exploded perspective view showing the exhaust valve shown in FIG. 1. FIG. 13 is a sectional view showing the exhaust valve in the closed state. FIG. 14 is a sectional view showing the exhaust valve in the open state. FIG. 15 is a side view showing the valve disc shown in FIG. 12. Here, in the explanations of the suction valve 8 and the exhaust valve 9, an end of each of the valves located inside the container main body 2 is defined as a front end.

Each of the check valves 8 and 9 has a cylindrical housing 11 as shown in FIGS. 3 to 6 and 12 to 14. Each of the housings 11 has a fixing cylinder (a first housing) 12 installed at the front end side and fixed to a bottom wall 2c and a valve disc containing cylinder (a second housing) 14 being installed on the rear end side and containing a valve disc 13 or 23. The valve disc containing cylinder 14 contains the valve disc 13 in the case of the suction valve 8 and the valve disc 23 in the case of the exhaust valve 9. Each of the housings 11 contains, besides the valve disc 13 or 23, a round filter 15, a filter retainer 16 to retain the filter 15, a compression coil spring (a biasing means) 17 to bias the valve disc 13 or 23, and O-rings 18 and 21. Further, each of the check valves 8 and 9 has a fixing ring 19 to fix the relevant housing 11 to the container main body 2. Here, the differences between the suction valve 8 and the exhaust valve 9 are that the valve discs 13 and 23 are installed respectively and that the O-rings 18, the valve discs 13 and 23, and the compression coil springs 17 are located reversely between the valves.

Each of the fixing cylinders 12 has a cylindrical shape and plural windows surrounded by a grid-like window frame 12a are formed at an end (the front end) of the fixing cylinder 12 as shown in FIG. 7. The end at which the grid-like window frame 12a is formed is located inside the container main body 2. Gas flows into the container main body 2 through the windows in the case of the suction valve 8 and gas flows outside the container main body 2 through the windows in the case of the exhaust valve 9. Further, a flange 12b protruding outward is formed all around the circumference at the end of each of the fixing cylinders 12.

Further, plural locking recesses 12d are formed on the inner circumferential face of a cylindrical sidewall 12c of each of the fixing cylinders 12 as shown in FIGS. 3, 6, 8, and 12. Then the locking recesses 12d engage with after-mentioned locking protrusions (a locking mechanism) 14b of each of the valve disc containing cylinders 14 respectively. Further, a groove 12f on which an O-ring 20 is mounted is formed on the outer face of each of the sidewalls 12c along the root of the relevant flange 12b.

Further, plural positioning recesses (notches) 12e are formed at the other end (the rear end) of the sidewall 12c of each of the fixing cylinders 12. The positioning recesses 12e are formed so as to be recessed from the rear end to the front side of the relevant sidewall 12c.

Furthermore, plural (four in the present embodiment) fixing pieces 12g protruding rearward are formed at the other end of the sidewall 12c of each of the fixing cylinders 12. The fixing pieces 12g are formed at identical intervals in the circumferential direction. Moreover, fixing claws 12i protruding outward in the radial direction are formed at the rear ends of the fixing pieces 12g, respectively. The fixing pieces 12g are flexible and the fixing claws 12i lock the relevant fixing ring 19 from inside.

The filter 15 is installed on the side of an end of each of the fixing cylinders 12 and prevents contaminations from intruding into the container main body 2. As the filter 15, for example: a molecular filter comprising tetrafluoroethylene, a polyester fiber, a porous Teflon film (registered trademark, bland name, a porous fluororesin film), a glass fiber, or the like; or a chemical filter produced by supporting a filtering medium such as an activated carbon fiber with a chemical absorbent is used. Here, the filter 15 may comprise either single sheet or plural sheets. Further, the filter 15 may be a combination of plural kinds of filters. For example, by combining a molecular filter with a chemical filter, it is possible to prevent substrates from being contaminated by particles in the container main body 2 and moreover prevent substrates from being contaminated by organic gas.

Each of the filter retainers 16 has a disc 6a and a cylinder 16b extending outward (rearward) from the disc 16a. The disc 16a has a size nearly identical to the filter 15 and plunges the filter 15 against the window frame 12a of each of the fixing cylinders 12 from inside. Further, the disc 16a and the cylinder 16b are installed coaxially with each other and plural through-holes 16c piercing through the disc 16a in the plate thickness direction are formed at the joint with the cylinder 16b on the disc 16a. Then gas passing through the interior of each of the housings 11 passes through the relevant through-holes 16c. Here, the interior of the cylinder 16b is closed and is structured so that gas may not pass through.

Each of the valve discs 13 and 23 has a columnar shape and an annular groove is formed on each of end faces 13a and 23a and an O-ring 18 is mounted in each of the grooves as shown in FIGS. 11 and 15. Each of the O-rings 18 protrudes outward from each of the end faces 13a and 23a of the valve discs 13 and 23 in the state where the O-ring is mounted on each of the valve discs 13 and 23. An annular sealing face 18a is formed by each of the O-rings 18. At the other ends 13b and 23b of the valve discs 13 and 23, degassing recesses 13c and 23c allowing gas to pass through are formed in the radial direction respectively.

Further, annular flanges 13e and 23e protruding outward are formed on the circumferential faces of the valve discs 13 and 23 respectively. The faces of the annular flanges 13e and 23e on the side of the other ends 13b and 23b form annular biasing faces 13f and 23f biased with the compression coil springs 17 respectively. Then the valve discs 13 and 23, the compression coil springs 17, and the O-rings 18 are installed nearly on an identical axis L respectively and the outer diameter D1 of each of the annular biasing faces 13f and 23f is set so as to be larger than the outer diameter D2 of each of the annular sealing faces 21a.

Further, plural guide ribs 13g and plural guide ribs 23g protruding toward the annular flanges 13e and 23e are formed on the circumferential faces of the valve discs 13 and 23 respectively in the manner of being equally spaced in the circumferential direction respectively. The guide ribs 13g and 23g are formed so as to intersect with the circumferential faces and the annular flanges 13e of the valve discs 13 and 23 respectively and installed so as to form triangles in a side view and expand in the radial direction from the sides of the other ends 13b and 23b toward the annular flanges 13e and 23e respectively. The compression coil springs 17 can be guided by the guide ribs 13g and 23g respectively and hence the compression coil springs 17 can easily be installed coaxially with the valve discs 13 respectively.

Further, a round opening 13d is formed on the valve disc 13 in the manner of extending from the other end 13b in the axial direction. The cylinder 16b of the relevant filter retainer 16 is inserted into the opening 13d. Meanwhile, a round opening 23d is formed on the valve disc 23 in the manner of extending from an end 23a in the axial direction. The cylinder 16b of the relevant filter retainer 16 is inserted into the opening 23d. Each of the valve discs 13 and 23 is mounted on the cylinder 16b of the relevant filter retainer 16 and is structured so as to be slidable in the axial direction L.

Each of the valve disc containing cylinders 14 has a cylindrical shape and has a size enough to contain one of the valve discs 13 and 23. A step on which an O-ring 21 is mounted is formed at the outer rim at an end as shown in FIGS. 4 to 6, 14, and 15. Further, each of the valve disc containing cylinders 14 has a folded flange 14a that is folded back from an end (the front end) and abuts on the inner circumferential face of the relevant fixing cylinder 12 all around the circumference. That is, each of the folded flanges 14a is inserted into the relevant fixing cylinder 12 and the outer circumferential face of the folded flange 14a abuts on the inner circumferential face of the sidewall 12c of the relevant fixing cylinder 12.

Further, locking protrusions 14b are formed at the positions corresponding to the locking recesses 12d of each of the fixing cylinders 12 on the outer circumferential face of the relevant folded flange 14a as shown in FIG. 6 (refer to FIG. 6). The locking protrusions 14b protrude outward from each of the folded flanges 14a and are constructed so as to be able to engage with the locking recesses 12d respectively. The locking recesses 12d of each of the fixing cylinders 12 and the locking protrusions 14b of the relevant valve disc containing cylinder 14 constitute locking mechanism for locking the relevant valve disc containing cylinder 14 to the fixing cylinder 12 according to the present invention.

Further, positioning protrusions 14c to engage with the positioning recesses 12e of each of the fixing cylinders 12 respectively are formed at the rear end of the relevant folded flange 14a as shown in FIG. 8. Each of the positioning protrusions 14c has an L-shape in a side view and protrudes rearward from the rear end of the relevant folded flange 14a and also outward from the rear end. The positioning recesses 12e of each of the fixing cylinders 12 and the positioning protrusions 14c of the relevant valve disc containing cylinder 14 constitute positioning mechanism for positioning the relevant valve disc containing cylinder 14 to the fixing cylinder 12 according to the present invention.

A flange 14d protruding inward is formed at the other end of each of the valve disc containing cylinders 14. The inner face of each of the flanges 14d is a flat surface. At the other end of each of the valve disc containing cylinders 14, an opening surrounded by the relevant flange 14d acts as a ventilation port 14e through which gas passes. The suction valve 8 allows gas to pass through the relevant ventilation port 14e and flow inside the relevant housing 11 and the exhaust valve 9 allows gas to pass through the relevant ventilation port 14e and flow outside the relevant housing 11.

Each of the fixing rings 19 has a cylindrical sidewall 19a and a flange 19b protruding outward from the rear end of the sidewall 19a as shown in FIGS. 3 to 5. The inner diameter of each of the sidewalls 19a is a little bit larger than the outer diameter of the sidewall 12c of the relevant fixing cylinder 12 and each of the sidewalls 19a is constructed so as to be able to be mounted outside the sidewall 12c of the relevant fixing cylinder 12. Each of the fixing rings 19 is mounted on the relevant fixing cylinder 12 from rearward.

Guide recesses 19c to guide fixing claws 12i respectively when each of the fixing rings 19 is mounted on the relevant fixing cylinder 12 are formed on the inner face of the relevant sidewall 19a as shown in FIGS. 9 and 10. The guide recesses 19c extend in the axial direction at the positions corresponding to the fixing claws 12i respectively. Further, each of the guide recesses 19c has a tilted face in the vicinity of the rear end of the relevant fixing ring 19. The tilted face tilts increasingly inward from the front to the rear. When each of the fixing rings 19 is mounted on the relevant fixing cylinder 12, the fixing claws 12i are guided by the guide recesses 19c and touch the tilted faces respectively and thereby the fixing pieces 12g bend inward. When the fixing claws 12i pass through the tilted faces, the fixing claws 12i come to protrude from the rear end of the relevant fixing ring 19 and the fixing pieces 12g are restored. On this occasion, each of the fixing rings 19 comes to be locked from inside with the fixing claws 12i and the rearward movement of the fixing ring 19 is constraint. Here, in FIG. 10, the guide recesses 19c are formed at positions where the guide recesses 19c overlap with the fixing claws 12i respectively.

Each of the flanges 19b is formed all around the circumference in the manner of facing the flange 12b of the relevant fixing cylinder 12 as shown in FIGS. 4 and 5. The flange 12b of each of the fixing rings 19 and the flange 12b of the relevant fixing cylinder 12 interpose the bottom wall 2c and the rib 10 of the container main body 2 and thereby it is possible to fix the relevant housing 11 to the container main body 2.

Further, each of the fixing rings 19 has detents 19d protruding inward and being able to abut on the fixing pieces 12g respectively as shown in FIGS. 9 and 10. The detents 19d have a tabular shape and are formed plurally so as to correspond to the fixing pieces 12g of the relevant fixing cylinder 12. When each of the fixing rings 19 is mounted on the relevant fixing cylinder 12 and is rotated in the circumferential direction (in the right direction in the present embodiment), the fixing pieces 12g abut on the detents 19d respectively and the movement of the fixing ring 19 in the circumferential direction can be constraint.

Further, each of the fixing rings 19 has hooks 19e that are bent from the detents 19d in the circumferential direction (in the left direction in the present embodiment) and locked to the fixing pieces 12g respectively. Each of the hooks 19e has a tabular shape, is bent from an end of the relevant detent 19d, and extends in the circumferential direction. The size of each of the hooks 19e in the circumferential direction corresponds to the width of each of the fixing pieces 12g and each of the hooks 19e has a protrusion to which the relevant fixing piece 12 can be locked from inside. In the state where each of the fixing rings 19 is locked to the relevant fixing cylinder 12, each of the fixing pieces 12g is interposed between the relevant sidewall 19a and the relevant hook 19e in the radial direction and also interposed between the relevant detent 19d and the relevant hook 19e in the circumferential direction.

Here, as the material for the check valves 8 and 9, for example a resin such as polycarbonate, polystyrene, polyethylene, a cycloolefin polymer, polyacetal, polyether-imide, or the like is used and it is desirable to produce the check valves 8 and 9 by properly selecting a material from among the above resins. Further, it is desirable that the fixing cylinder 12 and the valve disc containing cylinder 14 constituting each of the housings 11 are made of a transparent resin so as to be able to confirm the internal situation. Further, as the material for the O-rings 18, 20, and 21, for example one of various kinds of thermoplastic elastomers such as: rubber including melamine rubber, isoprene rubber, butyl rubber, silicone rubber, and fluororubber; a polyester thermoplastic elastomer; and a polyolefin elastomer is used. Further, as the material for the compression coil springs 17, a metal such as stainless steel, a resin, or the like is used. When compression coil springs 17 made of a metal are adopted, it is desirable to apply a coating formed by using a resin component such as PEEK, a coating formed by using an elastomer component, a diamond-like coating, or the like on the surface of the metal in order to prevent the interior of the container main body 2 from being contaminated by metal components.

The assembly of the suction valve 8 and the exhaust valve 9 of a substrate container 1 configured as stated above is hereunder explained. Firstly, a filter 15 and a filter retainer 16 are inserted into each of the fixing cylinders 12 while the other end (the end on the side of the fixing claws 12i) of the fixing cylinder 12 is turned upward.

Successively, in the case of the suction valve 8, the valve disc 13 on which the compression coil spring 17 and the O-ring 18 are mounted is installed on the filter retainer 16. More specifically, the compression coil spring 17 is installed between the filter retainer 16 and the valve disc 13 and the cylinder 16b of the filter retainer 16 is inserted into the opening 13d of the valve disc 13.

Meanwhile, in the case of the exhaust valve 9, the valve disc 23 on which the O-ring 18 is mounted and the compression coil spring 17 are installed on the filter retainer 16. More specifically, the cylinder 16b of the filter retainer 16 is inserted into the opening 23d of the valve disc 23 and the compression coil spring 17 is mounted from the side of the other end 23b of the valve disc 23.

Successively, each of the valve disc containing cylinders 14 on which an O-ring 21 is mounted is prepared and is mounted on the relevant fixing cylinder 12. More specifically, as shown in FIG. 6, the positioning protrusions 14c of each of the valve disc containing cylinders 14 are adjusted to the positioning recesses 12e of the relevant fixing cylinder 12 respectively, each of the valve disc containing cylinders 14 is plunged into the relevant fixing cylinder 12, and the locking protrusions 14b of each of the valve disc containing cylinders 14 are fitted to the locking recesses 12d of the relevant fixing cylinder 12 respectively. The state where the outer circumferential face of the folded flange 14a of each of the valve disc containing cylinders 14 abuts on the inner circumferential face of the sidewall 12c of the relevant fixing cylinder 12 is obtained. Further, each of the filters 15 and the disc 16a of the relevant filter retainer 16 are plunged and fixed onto the window frame 12a of the relevant fixing cylinder 12 by the other end of the relevant valve disc containing cylinder 14.

In the case of the suction valve 8, as shown in FIG. 4, an end of the compression coil spring 17 abuts on the disc 16a of the filter retainer 16 and the other end of the compression coil spring 17 abuts on the annular flame 13b of the valve disc 13. Then the valve disc 13 is biased by the compression coil spring 17 and the O-ring 18 mounted on the valve disc 13 is plunged on the inner face of the flange 14d of the valve disc containing cylinder 14. The face sealed with the O-ring 18 is formed so that the size thereof may be larger than the outer diameter of the ventilation port 14e in the manner of surrounding the ventilation port 14e of the valve disc containing cylinder 14. Consequently, it is possible to keep the container main body 2 sealed.

Meanwhile, in the case of the exhaust valve 9, as shown in FIG. 13, an end of the compression coil spring 17 abuts on the annular flange 23b of the valve disc 23 and the other end of the compression coil spring 17 abuts on the inner face of the flange 14d of the valve disc containing cylinder 14. Then the valve disc 23 is biased by the compression coil spring 17 and the O-ring 18 mounted on the valve disc 23 is plunged to the disc 16b of the filter retainer 16. The face sealed with the O-ring 18 is formed so that the size thereof may be larger than the outside of the plural through-holes 16c in the manner of surrounding the outside of the plural through-holes 16c of the filter retainer 16. Consequently, it is possible to keep the container main body 2 sealed.

Here, the ventilation port 14e of the exhaust valve 9 may be formed so as to be larger than the ventilation port 14e of the suction valve 8. By so doing, it comes to be easy to distinguish the suction valve 8 and the exhaust valve 9 from each other. Further, in the case of the exhaust valve 9 where the ventilation port 14e is not closed by the sealing face, a cleaning liquid intrudes into the valve disc containing cylinder 14 during cleaning and hence it is possible to improve the efficiency of draining and drying after cleaning by keeping the ventilation port 14e large.

The fixation of each of the housings 11 to the container main body 2 is hereunder explained. Firstly, an O-ring 20 is mounted on the groove 12f of each of the fixing cylinders 12 as shown in FIGS. 4, 5, 13, and 14. Successively, each of the fixing cylinders 12 is mounted on the relevant through-hole 2d on the bottom wall 2c of the container main body 2. More specifically, the other end of each of the fixing cylinders 12 is inserted into the relevant through-hole 2d from the inner face side of the container main body 2. Then the flange 12 of each of the fixing cylinders 12 abuts on the rim of the relevant through-hole 2d. On this occasion, the fixing claws 12i of each of the fixing cylinders 12 protrude outward from the relevant rib 10.

Successively, each of the fixing rings 19 is mounted on the fixing claws 12i of the relevant fixing cylinder 12 from the outer face side of the container main body 2. More specifically, as shown in FIG. 10, the guide recesses 19c of each of the fixing rings 19 are placed at positions corresponding to the fixing claws 12i of the relevant fixing cylinder 12 respectively and each of the fixing rings 19 is plunged to the relevant fixing cylinder 12. The fixing claws 12i are guided by the guide recesses 19c respectively and engage with the rim inside the flange 19b of each of the fixing rings 19. Successively, each of the fixing rings 19 is rotated relative to the relevant fixing cylinder 12 and the fixing pieces 12g of the relevant fixing cylinder 12 abut on the detents 19d of each of the fixing rings 19 respectively. In the state, the hooks 19e of each of the fixing rings 19 are locked to the relevant fixing pieces 12g respectively and the movement of each of the fixing rings 19 is constraint. Then the flange 19b of each of the fixing rings 19 abuts on the end of the relevant rib 10. That is, each of the housings 11 is firmly fixed to the container main body 2 in the manner of interposing the bottom wall 2c and the rib 10 of the container main body 2 between the flange 12b of the relevant fixing cylinder 12 and the flange 19b of the relevant fixing ring 19. Since each of the housings 11 is fixed to the container main body 2 with the relevant fixing ring 19 as stated above, it is unnecessary to fix each of the housings 11 with screws and control tightening torque unlike the conventional case.

The operations of the suction valve 8 are explained hereunder. In the suction valve 8 of the normal state, the valve disc 13 is plunged to the flange 14d of the valve disc containing cylinder 14 and the suction valve 8 is in the closed state as shown in FIG. 4. Then, when gas is supplied into the container main body 2, the valve disc 13 moves against the compression coil spring 17 by the pressure of the gas and the suction valve 8 takes the open state as shown in FIG. 5. The gas supplied into the container main body 2 flows into the housing 11 through the ventilation port 14e and passes through the through-holes 16c of the filter retainer 16 and the filter 15. The gas from which impurities are removed with the filter 15 passes through the windows of the fixing cylinder 12 and is supplied into the container main body 2. When the pressure of the supplied gas lowers, the valve disc 13 moves by being biased with the compression coil spring 17 and the suction valve 8 takes the closed state.

The operations of the exhaust valve 9 are explained hereunder. In the exhaust valve 9 of the normal state, the valve disc 23 is plunged to the disc 16a of the filter retainer 16 and the exhaust valve 9 is in the closed state as shown in FIG. 13. Then, when gas is exhausted outside the container main body 2, the valve disc 23 moves against the compression coil spring 17 by the pressure of the gas and the exhaust valve 9 takes the open state as shown in FIG. 14. The gas exhausted outside the container main body 2 passes through the windows of the fixing cylinder 12, the filter 15, and then the through-holes 16c of the filter retainer 16. The gas having passed through the through-holes 16c flows into the valve disc containing cylinder 14 and is exhausted trough the ventilation port 14e. When the pressure of the gas in the container main body 2 lowers, the valve disc 23 moves by being biased with the compression coil spring 17 and the exhaust valve 9 takes the closed state.

Such a substrate container 1 as stated above has a suction valve 8 and an exhaust valve 9 and hence it is possible to apply gas purge appropriately. Further, the housing 11 of each of the suction valve 8 and the exhaust valve 9 has a fixing cylinder 12 and a valve disc containing cylinder 14 and the fixing cylinder 12 and the valve disc containing cylinder 14 have positioning recesses 12e and positioning protrusions 14c respectively. Consequently, it is possible to position the valve disc containing cylinder 14 to the fixing cylinder 12 easily and assemble the suction valve 8 and the exhaust valve 9 efficiently. Further, since the fixing cylinder 12 and the valve disc containing cylinder 14 have locking recesses 12d and locking protrusions 14b respectively, it is possible to lock the valve disc containing cylinder 14 to the fixing cylinder 12. Consequently, it is unnecessary to join the housing 11 with screws unlike the conventional case. Furthermore, in each of the suction valve 8 and the exhaust valve 9 of the substrate container 1, the housing 11 can be fixed to the container main body 2 with the fixing ring 19 and hence it is unnecessary to fix the housing 11 with screws unlike the conventional case. Consequently, since screw joint is not required unlike the conventional case, it is unnecessary to control tightening torque. As a result, assembly work can be simplified.

Further, since each of the fixing cylinders 12 has fixing pieces 12g and fixing claws 12i to fix the relevant fixing ring 19, it is possible to fix the relevant fixing ring 19 to the fixing cylinder 12 without fail. Furthermore, since each of the fixing rings 19 has a flange 19b protruding outward, the relevant housing 11 is stably fixed to the container main body 2 by abutting the flange 19b on the rim of the relevant through-hole 2d of the container main body 2. Yet further, since guide recesses 19c to guide the movement of the fixing claws 12i are formed on the inner circumferential face of the sidewall 19a of each of the fixing rings 19, it is possible to smoothly mount the fixing ring 19 on the relevant fixing cylinder 12. Consequently, it is possible to further improve the efficiency of assembly work. In addition, since detents 19e protruding inward and being able to abut on the fixing pieces 12g respectively and hooks 19e bending from the detents 19e toward the circumferential direction and being locked to the fixing pieces 12g respectively are formed on the inner circumferential face of the sidewall 19a of each of the fixing rings 19, it is possible to lock the hooks 19e of the fixing ring 19 to the fixing pieces 12g of the relevant fixing cylinder 12 respectively by mounting the fixing ring 19 on the fixing pieces 12g and rotating the fixing ring 19 relative to the relevant fixing cylinder 12.

Further, since the outer diameter D1 of each of the annular biasing faces 13f and 23f biased with the relevant compression coil spring 17 is larger than the outer diameter D2 of the annular sealing face 18a of each of the valve discs 13 and 23, it is possible to prevent the valve discs 13 and 23 from tilting and seal off gas without fail. Furthermore, since degassing recesses 13c and 23c allowing gas to pass through are formed in the radial direction at the other ends 13b and 23b on the other side of the ends 13a and 23a at which the sealing faces 18a are formed respectively, it is possible to let the gas pass through the degassing recesses 13c and 23c even when the other end 13b touches the disc 16a of the relevant filter retainer 16 or the other end 23b touches the flange 14b of the relevant valve disc containing cylinder 14. Consequently, it is possible to prevent an unnecessary sealing face from forming on the side opposite to the sealing face 18a.

Although the present invention has heretofore been explained concretely on the basis of the embodiment, the present invention is not limited to the above embodiment. Although substrates are specified as the objects contained in a substrate container according to the present invention in the above embodiment, the contained substrates are not limited to semiconductor wafers and other substrates such as mask glasses may also be contained.

Further, although a bottom plate 7 is installed in the above embodiment, the bottom plate 7 may not be installed.

Furthermore, although a compression coil spring 17 is used as the biasing means in the above embodiment, a flat spring or a rubber including a thermoplastic elastomer may be used for example. Here, as the material for a flat spring, stainless steel or resin is used.

Further, although the outer diameter D1 of each of the annular biasing faces is larger than the outer diameter D2 of the relevant annular sealing face 18a in the above embodiment, the outer diameter D1 of each of the biasing faces may be smaller than the outer diameter D2 of the relevant sealing face. It is desirable however that the outer diameter D1 of each of the biasing faces is not smaller than the outer diameter D2 of the relevant sealing face.

INDUSTRIAL APPLICABILITY

The present invention provides: check valves that do not require the control of tightening torque and can simplify assembly work; and a substrate container equipped with the check valves.

The invention claimed is:
1. A substrate container comprising
a container main body to contain a substrate and a check valve which has a cylindrical housing and a valve disc installed in the housing and controls gas flowing from and to the interior and the exterior of the container main body; and
being formed by inserting the housing into a through-hole of the container main body,
wherein, when an end of the valve located inside the container main body is defined as a front end:
a check valve has a fixing ring that is mounted on a rear end side in a manner of being rotatable relative to the housing and fixes the housing to the container main body from rearward;
the housing has a first housing installed on the front end side and a second housing inserted into the first housing at the front end and attached to the first housing;

the first housing has a fixing piece protruding rearward from a rear end and a fixing claw being formed at a rear end of the fixing piece and fixing the fixing ring;

the fixing ring has a cylindrical sidewall mounted outside the first housing and a flange protruding outward from the sidewall; and on an inner circumferential face of the sidewall, a guide recess extending in an axial direction and guiding the fixing claw, a detent protruding inward and abutting on the fixing piece, and a hook bent from the detent in a circumferential direction and locked to the fixing piece are installed, wherein the check valve further has a positioning mechanism to position the second housing to the first housing and a locking mechanism to lock the second housing to the first housing, and wherein the positioning mechanism has a positioning recess formed at a rear end of the first housing and a positioning protrusion being formed at the folded flange of the second housing and engaging with the positioning recess.

2. A substrate container according to claim 1, wherein:

the second housing has a folded flange being folded back from the front end side and abutting on the inner circumferential face of the first housing all around the circumference; and the locking mechanism has a locking recess formed on the inner circumferential face of the first housing and a locking protrusion being formed at the folded flange of the second housing and engaging with the locking recess.

3. A substrate container according to claim 2, wherein the positioning mechanism has a positioning recess formed at the rear end of the first housing and a positioning protrusion being formed at the folded flange of the second housing and engaging with the positioning recess.

4. A substrate container according to claim 3, wherein:

the valve disc has a columnar shape;

the valve disc has an end at which an annular sealing face is formed, an annular flange at which an annular biasing face biased by a biasing means is formed, and other end at which a degassing recess allowing gas to pass through is formed in a radial direction;

the annular sealing face is nearly concentric with the annular biasing face; and the outer diameter of the annular biasing face is not smaller than the outer diameter of the annular sealing face.

5. A substrate container according to claim 2, wherein:

the valve disc has a columnar shape;

the valve disc has an end at which an annular sealing face is formed, an annular flange at which an annular biasing face biased by a biasing means is formed, and other end at which a degassing recess allowing gas to pass through is formed in a radial direction;

the annular sealing face is nearly concentric with the annular biasing face; and the outer diameter of the annular biasing face is not smaller than the outer diameter of the annular sealing face.

6. A substrate container according to claim 1, wherein:

the valve disc has a columnar shape;

the valve disc has an end at which an annular sealing face is formed, an annular flange at which an annular biasing face biased by a biasing means is formed, and other end at which a degassing recess allowing gas to pass through is formed in a radial direction;

the annular sealing face is nearly concentric with the annular biasing face; and the outer diameter of the annular biasing face is not smaller than the outer diameter of the annular sealing face.

7. A substrate container according to claim 1, wherein:

the valve disc has a columnar shape;

the valve disc has an end at which an annular sealing face is formed, an annular flange at which an annular biasing face biased by a biasing means is formed, and other end at which a degassing recess allowing gas to pass through is formed in a radial direction;

the annular sealing face is nearly concentric with the annular biasing face; and the outer diameter of the annular biasing face is not smaller than the outer diameter of the annular sealing face.

8. A substrate container according to claim 1, wherein the valve disc is contained in the first housing and the second housing.

9. A substrate container according to claim 1, wherein the check valve is fixed to the container main body by engaging the fixing claw of the first housing and the hook bent of the fixing ring.

10. A substrate container according to claim 1, wherein the second housing has a folded flange abutting on an entire circumference of the inner circumferential face of the first housing, and wherein the first housing and the second housing are coupled by engaging the locking mechanism provided on the folded flange and the locking mechanism of the inner circumferential face of the first housing.

11. A check valve being inserted into a through-hole of a container main body of a substrate container containing a substrate and controlling gas flowing from and to the interior and the exterior of the substrate container, wherein, when an end of the check valve located inside the container main body is defined as a front end:

the check valve has a cylindrical housing mounted on the through-hole, a valve disc contained in the housing, and a fixing ring that is mounted on a rear end side of the housing in a manner of being rotatable relative to the housing and fixes the housing to the container main body from rearward;

the housing has a first housing installed on the front end side and a second housing inserted into the first housing at the front end and attached to the first housing;

the first housing has a fixing piece protruding rearward from a rear end and a fixing claw being formed at a rear end of the fixing piece and fixing the fixing ring;

the fixing ring has a cylindrical sidewall mounted outside the first housing and a flange protruding outward from the sidewall; and on an inner circumferential face of the sidewall, a guide recess extending in an axial direction and guiding the fixing claw, a detent protruding inward and abutting on the fixing piece, and a hook bent from the detent in a circumferential direction and locked to the fixing piece are installed, wherein the check valve further has a positioning mechanism to position the second housing to the first housing and a locking mechanism to lock the second housing to the first housing, and wherein the positioning mechanism has a positioning recess formed at the rear end of the first housing and a positioning protrusion being formed at the folded flange of the second housing and engaging with the positioning recess.

12. A check valve according to claim 11, wherein the check valve further has a positioning mechanism to position the second housing to the first housing and a locking mechanism to lock the second housing to the first housing.

13. A check valve according to claim 11, wherein the valve disc is contained in the first housing and the second housing.

14. A check valve according to claim 11, wherein the check valve is fixed to the container main body by engaging the fixing claw of the first housing and the hook bent of the fixing ring.

15. A check valve according to claim 11,
wherein the second housing has a folded flange abutting on an entire circumference of the inner circumferential face of the first housing, and
wherein the first housing and the second housing are coupled by engaging the locking mechanism provided on the folded flange and the locking mechanism of the inner circumferential face of the first housing.

* * * * *